(12) United States Patent
Miyazaki et al.

(10) Patent No.: US 8,592,933 B2
(45) Date of Patent: Nov. 26, 2013

(54) PHOTOELECTRIC CONVERSION DEVICE, FABRICATION METHOD FOR THE SAME, AND SOLID STATE IMAGING DEVICE

(75) Inventors: Kenichi Miyazaki, Kyoto (JP); Osamu Matsushima, Kyoto (JP); Shigeru Niki, Ibaraki (JP); Keiichiro Sakurai, Ibaraki (JP); Shogo Ishizuka, Ibaraki (JP)

(73) Assignees: Rohm Co., Ltd., Kyoto (JP); National Institute of Advanced Industrial Science and Technology, Tokyo (JP)

( * ) Notice: Subject to any disclaimer, the term of this patent is extended or adjusted under 35 U.S.C. 154(b) by 187 days.

(21) Appl. No.: 12/937,013

(22) PCT Filed: Mar. 30, 2009

(86) PCT No.: PCT/JP2009/056523
§ 371 (c)(1),
(2), (4) Date: Oct. 8, 2010

(87) PCT Pub. No.: WO2009/125688
PCT Pub. Date: Oct. 15, 2009

(65) Prior Publication Data
US 2011/0024859 A1    Feb. 3, 2011

(30) Foreign Application Priority Data
Nov. 4, 2008    (JP) ............................... P2008-104052

(51) Int. Cl.
*H01L 31/00*    (2006.01)

(52) U.S. Cl.
USPC ................... 257/444; 257/451; 257/E31.027; 438/59

(58) Field of Classification Search
USPC ............. 257/439, 444, 451, E31.027; 438/59
See application file for complete search history.

(56) References Cited

U.S. PATENT DOCUMENTS

| 5,436,204 A | 7/1995 | Albin et al. |
| 5,441,897 A | 8/1995 | Noufi et al. |

(Continued)

FOREIGN PATENT DOCUMENTS

| EP | 1 950 811 | 7/2008 |
| JP | 02-42769 | 2/1990 |

(Continued)

OTHER PUBLICATIONS

Rohm Co., Ltd. et al., Specification for U.S. Appl. No. 13/645,334 (Oct. 4, 2012).

*Primary Examiner* — Allan R Wilson
(74) *Attorney, Agent, or Firm* — Fish & Richardson P.C.

(57) ABSTRACT

A photoelectric conversion device has a high S/N ratio and can increase the detection efficiency even under a low luminance. The photoelectric conversion device generates an increased electric charge by impact ionization in a photoelectric conversion unit formed from a chalcopyrite type semiconductor, so as to improve dark current characteristic. The photoelectric conversion device includes: a lower electrode layer; a compound semiconductor thin film of chalcopyrite structure disposed on the lower electrode layer and having a high resistivity layer on a surface; and a transparent electrode layer disposed on the compound semiconductor thin film, wherein the lower electrode layer, the compound semiconductor thin film, and the transparent electrode layer are laminated one after another, and a reverse bias voltage is applied between the transparent electrode layer and the lower electrode layer, and the multiplication by the impact ionization of the electric charge generated by photoelectric conversion is generated within the compound semiconductor thin film. It is also possible to provide a fabrication method for such photoelectric conversion device, and a solid state imaging device using the photoelectric conversion device.

5 Claims, 20 Drawing Sheets

(56) References Cited

U.S. PATENT DOCUMENTS

| | | | |
|---|---|---|---|
| 5,858,121 A * | 1/1999 | Wada et al. | 136/265 |
| 5,918,111 A | 6/1999 | Kohara et al. | |
| 7,217,983 B2 * | 5/2007 | Suzuki | 257/444 |
| 8,299,510 B2 | 10/2012 | Matsushima et al. | |
| 2003/0052391 A1 * | 3/2003 | Stanbery | 257/635 |
| 2003/0113481 A1 * | 6/2003 | Huang et al. | 427/580 |
| 2005/0205901 A1 * | 9/2005 | Suzuki | 257/291 |
| 2007/0069258 A1 * | 3/2007 | Ahn | 257/290 |
| 2007/0289624 A1 | 12/2007 | Kuriyagawa et al. | |
| 2008/0035199 A1 * | 2/2008 | Kume et al. | 136/264 |
| 2009/0218650 A1 * | 9/2009 | Lee | 257/458 |
| 2010/0044676 A1 * | 2/2010 | Sargent et al. | 257/21 |
| 2010/0102368 A1 * | 4/2010 | Matsushima et al. | 257/293 |
| 2011/0205412 A1 * | 8/2011 | Miyazaki et al. | 348/294 |
| 2012/0056192 A1 * | 3/2012 | Nam et al. | 257/76 |
| 2012/0329195 A1 * | 12/2012 | Leidholm et al. | 438/62 |

FOREIGN PATENT DOCUMENTS

| | | |
|---|---|---|
| JP | 08-330232 | 12/1996 |
| JP | 09-82932 | 3/1997 |
| JP | 09-102627 | 4/1997 |
| JP | 2001-144279 | 5/2001 |
| JP | 2003-273135 | 9/2003 |
| JP | 2007-123720 | 5/2007 |
| JP | 2007-123721 | 5/2007 |
| WO | 2006/016577 | 2/2006 |
| WO | 2007/052667 | 5/2007 |

* cited by examiner (a)  (b)

(a)

(b)

FIG. 8
(a)
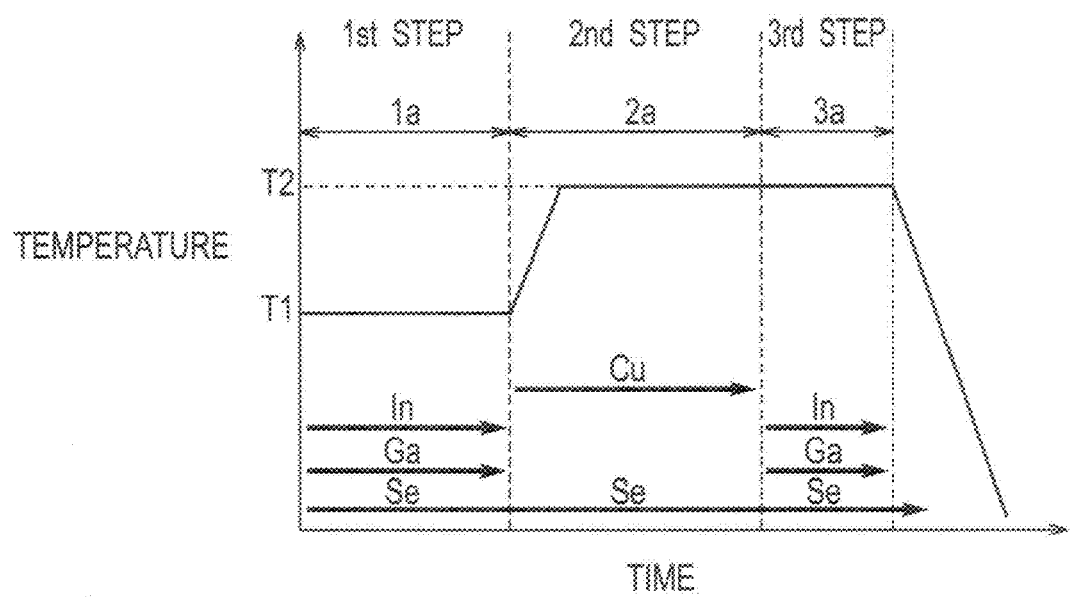
(b)
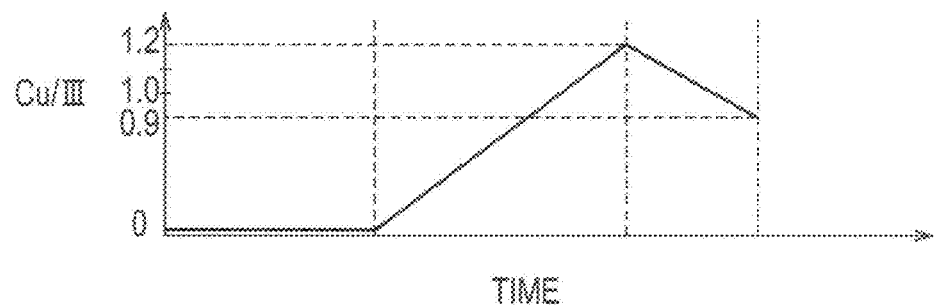

FIG. 20
(a)
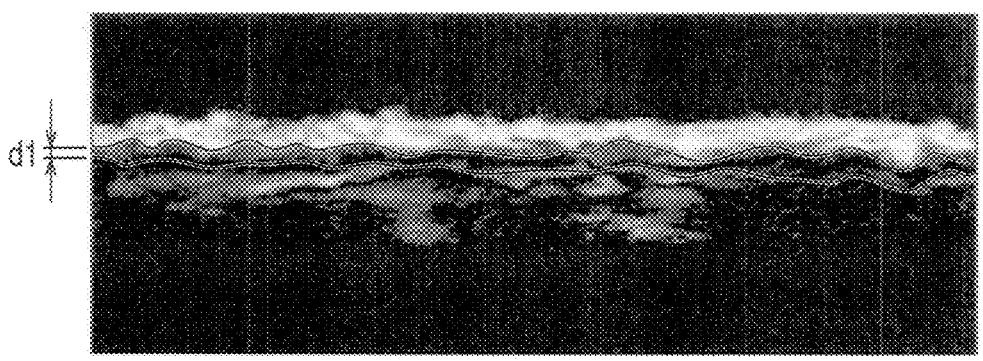
(b)
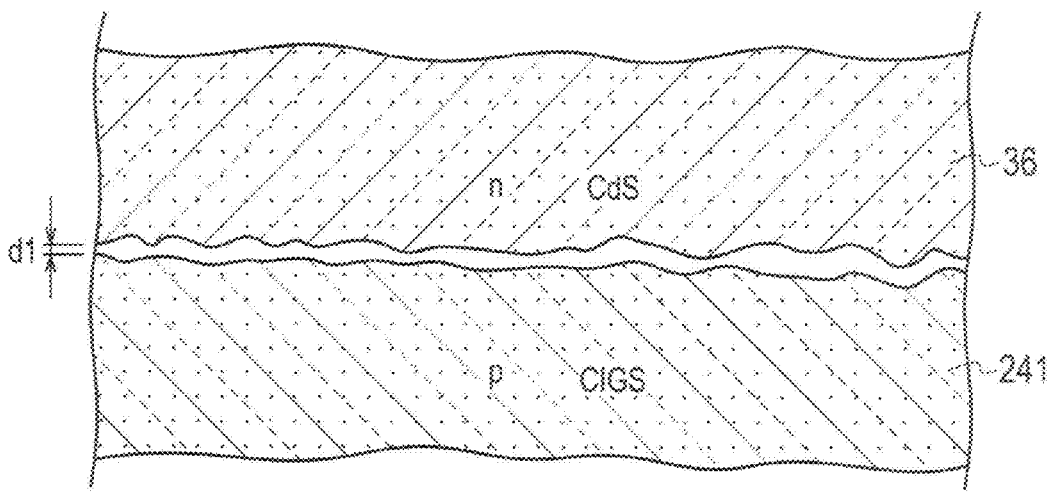

FIG. 21
(a)
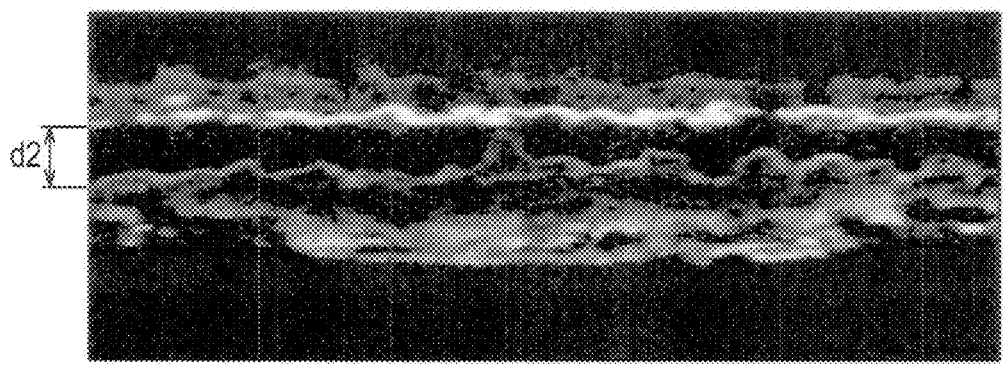
(b)
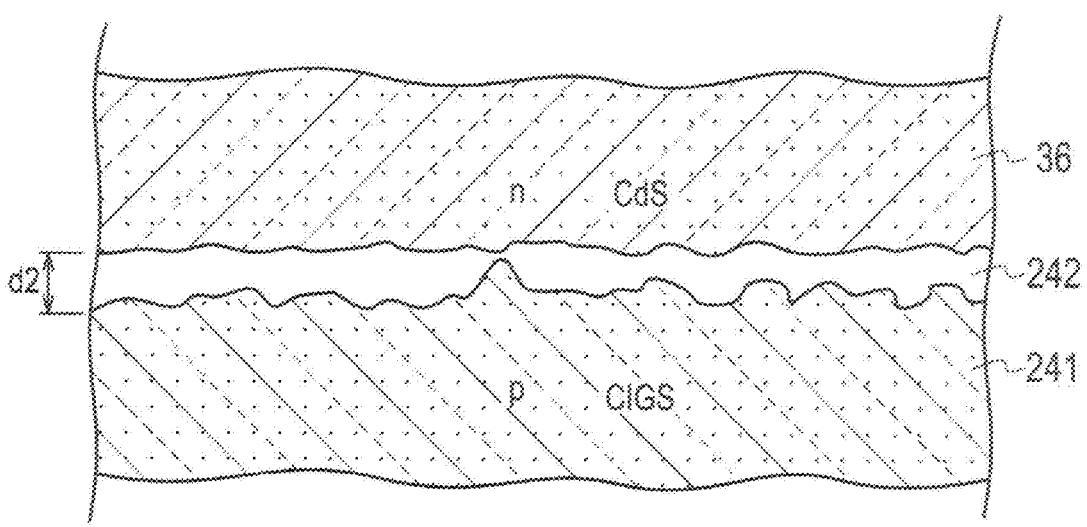

FIG. 23
(a) 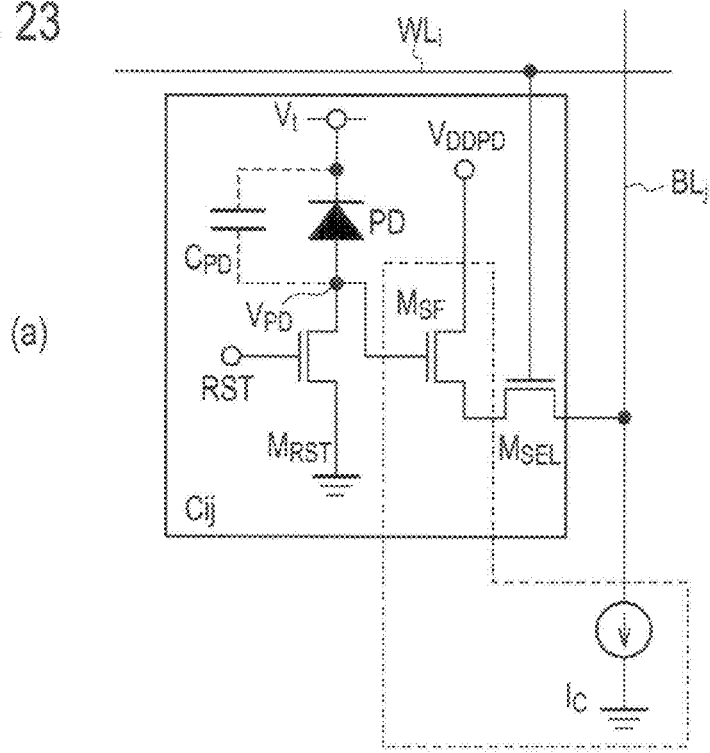
(b) 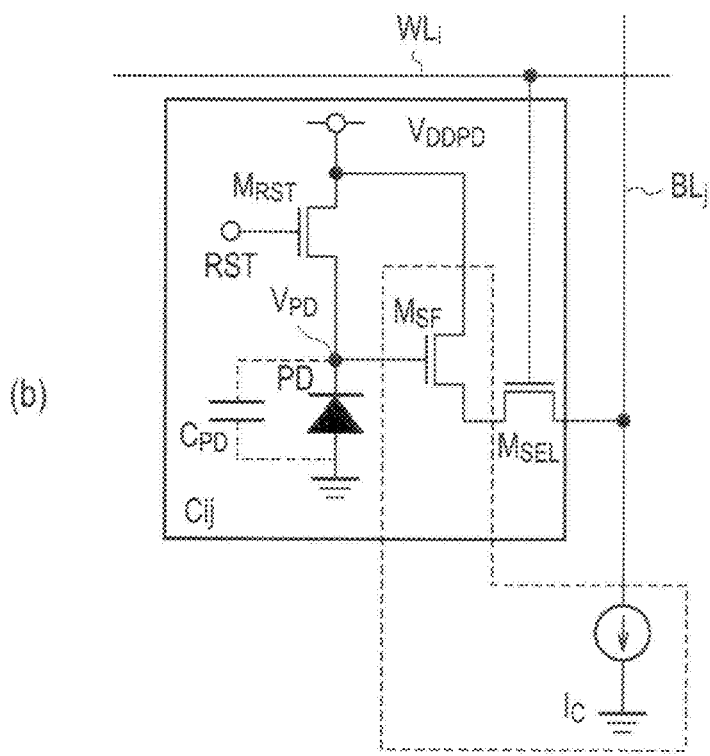

PHOTOELECTRIC CONVERSION DEVICE, FABRICATION METHOD FOR THE SAME, AND SOLID STATE IMAGING DEVICE

TECHNICAL FIELD

The present invention relates to a photoelectric conversion device, a fabrication method for such photoelectric conversion device, and a solid state imaging device. In particular, the present invention relates to a photoelectric conversion device which improves dark current characteristics of a photoelectric conversion unit having a compound semiconductor film of chalcopyrite structure, a fabrication method for such photoelectric conversion device, and a solid state imaging device.

BACKGROUND ART

The thin film solar cell which used $CuInSe_2$ (CIS based thin film) which is a semiconductor thin film of chalcopyrite structure composed of a group Ib element, a group IIIb element, and a group VIb element, or $Cu(In, Ga)Se_2$ (CIGS based thin film) which dissolved Ga to the $CuInSe_2$ for an optical absorption layer shows high energy conversion efficiency, and has advantage that there is little degradation of the efficiency by light irradiation etc.

However, film formation by 550 degrees C. from a viewpoint of degradation of film quality and increase of leakage current is general, in formation of the CIS based thin film which is the semiconductor thin film of chalcopyrite structure, or the CIGS based thin film which dissolves Ga to CIS based thin film. When it forms at low temperature rather than 550 degrees C., it has been considered that particle diameter is small composed and dark current characteristics degrade, conventionally. In addition, the heat-resistant limitation of an integrated circuit is about 400 degrees C.

It is already disclosed about a photoelectric conversion device which used a compound semiconductor thin film of chalcopyrite structure to reduce dark current substantially, and a fabrication method for the such photoelectric conversion device (for example, refer to Patent Literature 1 and Patent Literature 2).

Also, it is already disclosed about a formation method by a selenium process of a high quality CIGS based thin film (for example, refer to Patent Literature 3 and Patent Literature 4).

On the other hand, it is already disclosed about: a solid state imaging element characterized by forming a switching device by a thin film transistor on a substrate and composing to laminate a sensor area by an amorphous semiconductor layer via the picture element electrode connected to the above-mentioned switching device; or a solid state imaging element composed to form by an insulating substrate as the above-mentioned substrate (for example, refer to Patent Literature 5).

In the solid state imaging element disclosed in Patent Literature 4, since the amorphous semiconductor layer is applied into the photosensing area, a photoelectric conversion wavelength is mainly a visible light wavelength region.

In such a conventional solid state imaging element, since a low electric field is applied to a photoelectric conversion film and an electric charge is detected, the photoelectric conversion film itself has no multiplication function.
Citation List
  Patent Literature 1: Japanese Patent Application Laying-Open Publication No. 2007-123720
  Patent Literature 2: Japanese Patent Application Laying-Open Publication No. 2007-123721
  Patent Literature 3: U.S. Pat. No. 5,436,204
  Patent Literature 4: U.S. Pat. No. 5,441,897
  Patent Literature 5: Japanese Patent Application Laying-Open Publication No. 2001-144279

SUMMARY OF INVENTION

Technical Problem

A CIS based thin film and CIGS based thin film prevail in use as a solar cell currently.

On the other hand, the inventors of the present invention are paying their attention to a high optical absorption coefficient of this compound semiconductor thin film material and characteristics with the high sensitivity which reaches the large wavelength region from visible light to near infrared light wavelength region, and are examining using this compound semiconductor thin film material as an image sensor for a security camera (camera which performs sensing of the visible light at daytime and performs sensing of the near infrared light wavelength region at night), a personal authentication camera (camera for performing personal authentication with the near infrared light wavelength region which is not affected by an influence of outdoor daylight) or an in-vehicle camera (camera mounted in a car for visual aid at night, distant visual field securing, etc.).

The object of the present invention is to provide a photoelectric conversion device of high S/N ratio which improved detection efficiency substantially also with low illumination, a fabrication method for such photoelectric conversion device, and a solid state imaging device, by applying a high electric field to a photoelectric conversion unit which used a chalcopyrite type semiconductor, and generating the multiplication of an electric charge by impact ionization, and improving dark current characteristics.

The object of the present invention is to provide a photoelectric conversion device which the multiplication not observed conventional can be observed by improving dark current characteristics, and can also be detected in the light of low illumination, a fabrication method for such photoelectric conversion device, and a solid state imaging device.

Solution to Problem

A photoelectric conversion device according to embodiments of the invention, a fabrication method for such photoelectric conversion device, and a solid state imaging device have the characteristic at the point which deposits a semiconductor layer composed of high resistivity layer (i type CIGS layer) on a p type chalcopyrite based semiconductor surface.

According to one aspect of the present invention for achieving the above-mentioned object, it is provided of a photoelectric conversion device comprising: a circuit unit formed on a substrate; a lower electrode layer disposed on the circuit unit, a compound semiconductor thin film of chalcopyrite structure disposed on the lower electrode layer; and a transparent electrode layer disposed on the compound semiconductor thin film, wherein the lower electrode layer, the compound semiconductor thin film, and the transparent electrode layer are laminated one after another on the circuit unit, and the reverse bias voltage is applied between the transparent electrode layer and the lower electrode layer and the multiplication of electric charge generated by photoelectric conversion is made to generate by impact ionization within the compound semiconductor thin film of the chalcopyrite structure.

According to another aspect of the present invention, it is provided of a fabrication method for a photoelectric conversion device comprising: holding, as a first step, a substrate temperature to a first temperature and maintains a composition ratio of (Cu/(In+Ga)) at 0 in a group III element being a rich state; holding, as a second step, the substrate temperature from the first temperature to a second temperature higher than the first temperature, and shifting the composition ratio of (Cu/(In+Ga)) to the rich state of Cu element which is more than 1.0; and shifting, as a third step, from the rich state of Cu element of the composition ratio of (Cu/(In+Ga)) which is more than 1.0 to the rich state of group III element of the composition ratio of (Cu/(In+Ga)) which is not more than 1.0, wherein the third step forms a compound semiconductor thin film of chalcopyrite structure by having a first period that holds the substrate temperature to the second temperature, and a second period that holds the substrate temperature from the second temperature to the third temperature lower than the first temperature.

According to another aspect of the present invention, it is provided of a solid state imaging device comprising: a circuit unit formed on a substrate; a lower electrode layer disposed on the circuit unit and mutually separated between pixels adjoining to a column direction or a row direction; a compound semiconductor thin film of chalcopyrite structure disposed on the lower electrode layer and mutually separated between pixels adjoining to a column direction or a row direction; and a transparent electrode layer disposed on the compound semiconductor thin film and having planarization structure between adjoining pixels, wherein the lower electrode layer, the compound semiconductor thin film, and the transparent electrode layer are laminated one after another on the circuit unit, and a reverse bias voltage is applied between the transparent electrode layer and the lower electrode layer and the multiplication of electric charge generated by photoelectric conversion is made to generate by impact ionization within the compound semiconductor thin film of the chalcopyrite structure.

According to another aspect of the present invention, it is provided of a solid state imaging device comprising: a plurality of word lines $WL_i$ (where i=1 to m, and m is an integer) disposed in a row direction; a plurality of bit lines $BL_j$ (where j=1 to n, and n is an integer) disposed in a column direction; and a pixel including a photo diode having a lower electrode layer, a compound semiconductor thin film of chalcopyrite structure disposed on the lower electrode layer, and a transparent electrode layer disposed on the compound semiconductor thin film, and disposed in an intersection of the plurality of word lines $WL_i$ and the plurality of bit lines wherein the lower electrode layer, the compound semiconductor thin film, and the transparent electrode layer are laminated one after another, and a reverse bias voltage is applied between the transparent electrode layer and the lower electrode layer and the multiplication of electric charge generated by photoelectric conversion is made to generate by impact ionization within the compound semiconductor thin film of the chalcopyrite structure.

Advantageous Effects of Invention

According to the present invention, it can provide the photoelectric conversion device of high S/N ratio which improved detection efficiency substantially also with low illumination, and the fabrication method for such photoelectric conversion device, and a solid state imaging device, by applying the high electric field to the photoelectric conversion unit which used the chalcopyrite type semiconductor, and generating the multiplication of the electric charge by impact ionization, and improving the dark current characteristics.

According to the present invention, it can provide the photoelectric conversion device which the multiplication phenomenon not observed conventional can be observed by improving dark current characteristics, and can also be detected in the light of low illumination, and the fabrication method for such photoelectric conversion device.

According to the present invention, it can provide the solid state imaging device of high S/N ratio which improved detection efficiency substantially also with low illumination, by applying the high electric field to the photoelectric conversion unit which used the chalcopyrite type semiconductor, and generating the multiplication of the electric charge by impact ionization, and improving the dark current characteristics.

According to the present invention, it can provide the solid state imaging device which the multiplication phenomenon not observed conventional can be observed by improving dark current characteristics, and can also be detected in the light of low illumination.

BRIEF DESCRIPTION OF DRAWINGS

[FIG. 8] A detailed explanation diagram of the formation process of the compound semiconductor thin film of chalcopyrite structure, in the fabrication method for the photoelectric conversion device according to a comparative example of the present invention,
(a) A diagram showing a component at the time of forming membranes and a substrate temperature in each stage, and
(b) A diagram showing a composition ratio of (Cu/(In+Ga)) in each stage

(a) Relationship between dark current density (A/cm$^2$) and Cu/group III ratio of a result which applied the fabrication method for the photoelectric conversion device to test structure, and (b) An SEM photograph of an example of the test structure which laminated Mo and CIGS on a substrate

Figure 13:
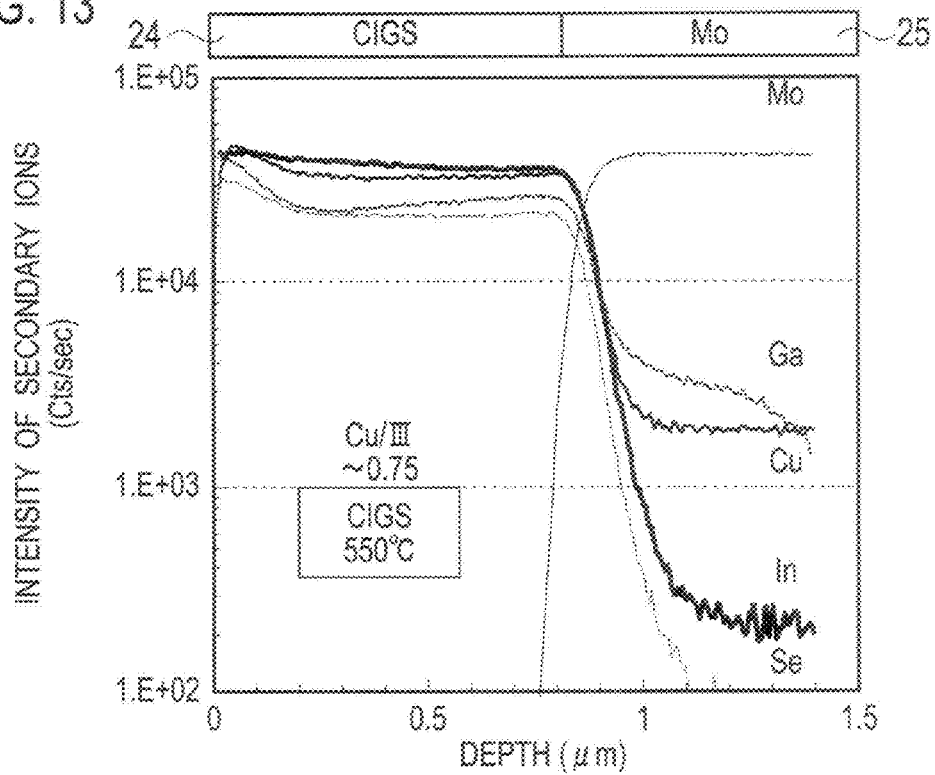

[FIG. 13] The analysis result by SIMS of the photoelectric conversion unit formed by the fabrication method for the photoelectric conversion device according to the comparative example of the present invention

Figure 14:
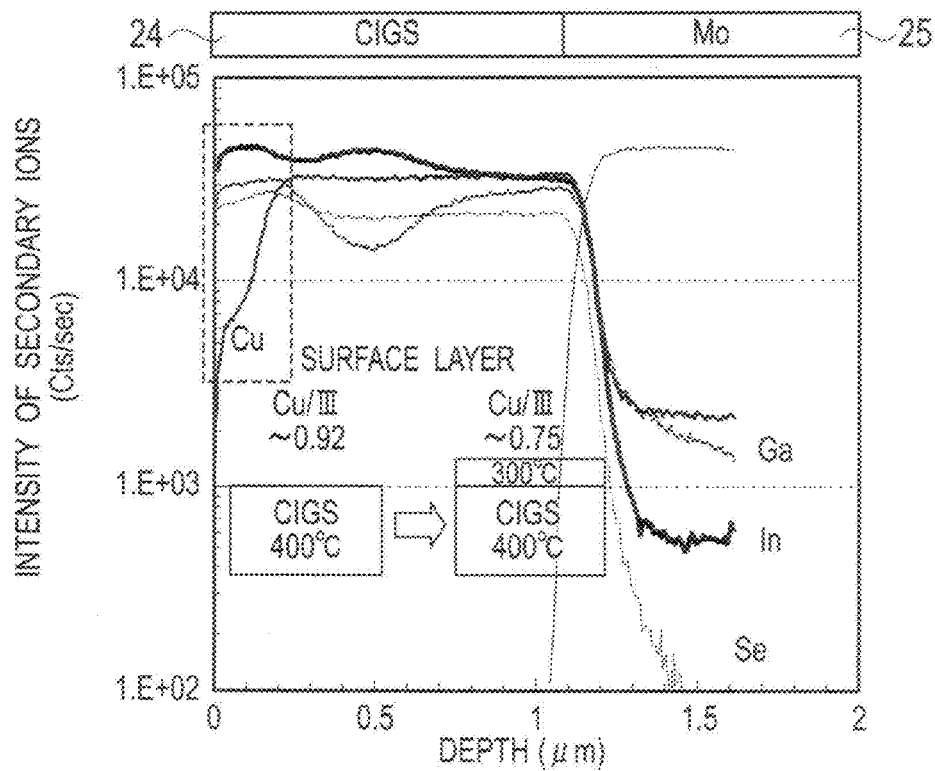

[FIG. 14] The analysis result by SIMS of the photoelectric conversion unit formed by the fabrication method for the photoelectric conversion device according to the first embodiment of the present invention

Figure 15:
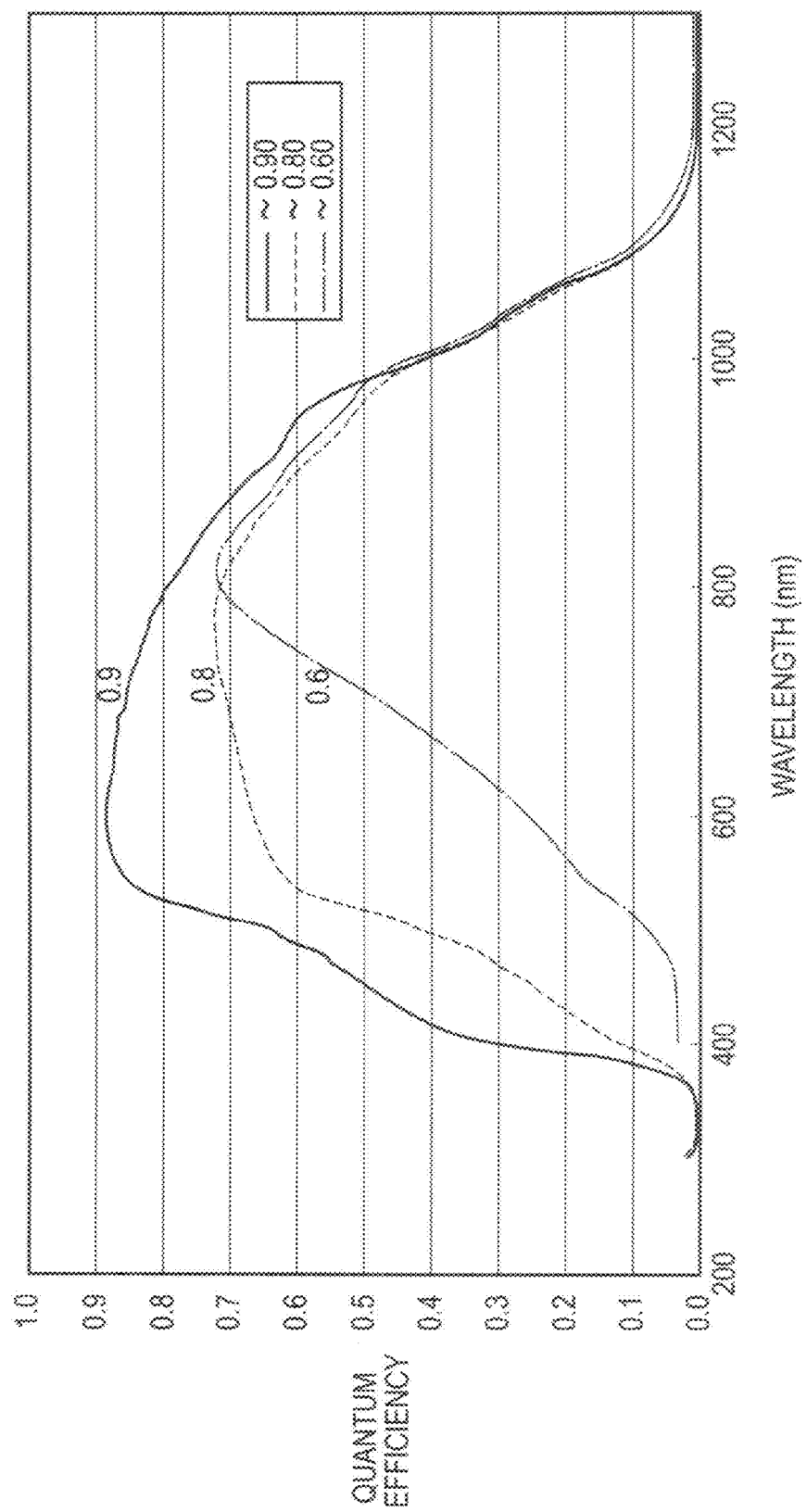

[FIG. 15] A wavelength characteristic of quantum efficiency which applies a parameter the value of Cu/group III ratio of the compound semiconductor thin film (CIGS thin film) formed by the fabrication method for the photoelectric conversion device according to the first embodiment of the present invention

Figure 16:
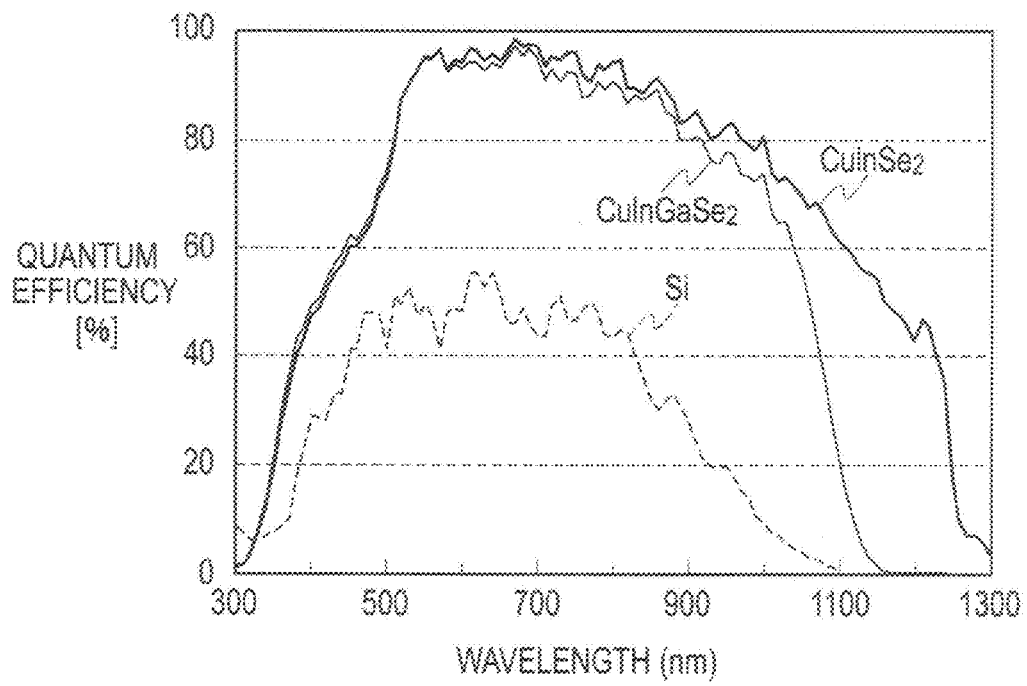

[FIG. 16] A wavelength characteristic of the quantum efficiency of the photoelectric conversion device according to the first embodiment of the present invention

Figure 17:
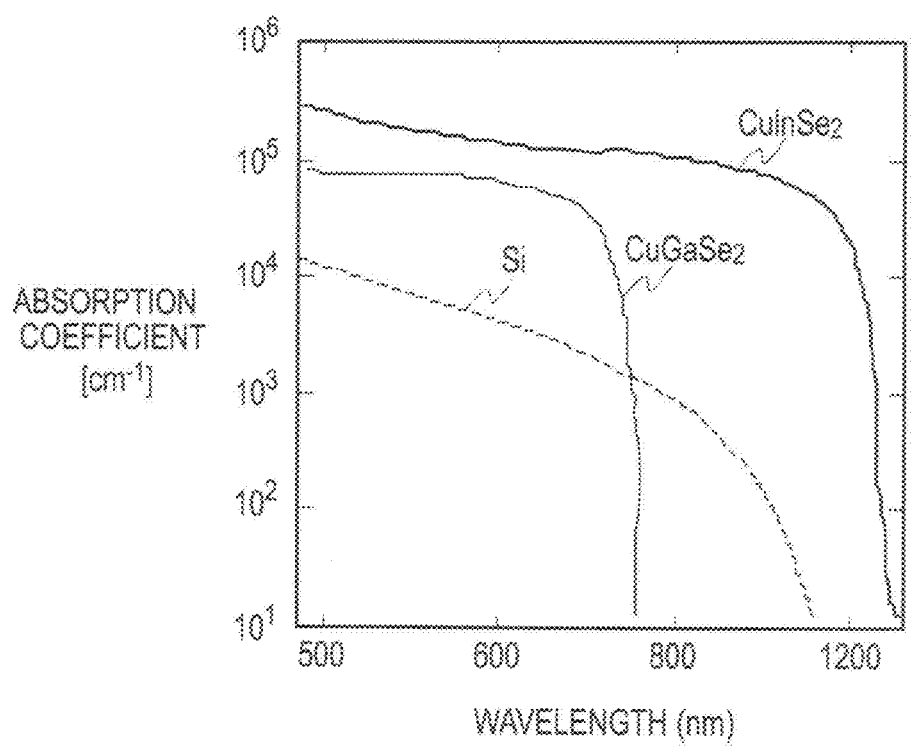

[FIG. 17] An optical absorption characteristics diagram of the photoelectric conversion device according to the first embodiment of the present invention

Figure 18:
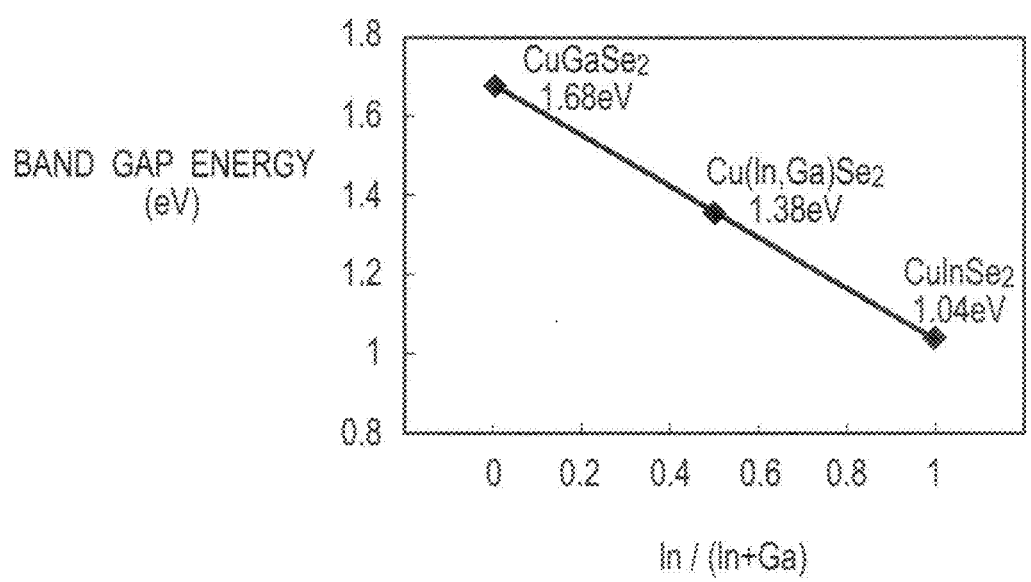

[FIG. 18] A dependence characteristics diagram between a bandgap energy and In/(In+Ga) composition ratio of the compound semiconductor thin film of chalcopyrite structure applied to the photoelectric conversion device according to the first embodiment of the present invention

Figure 19:
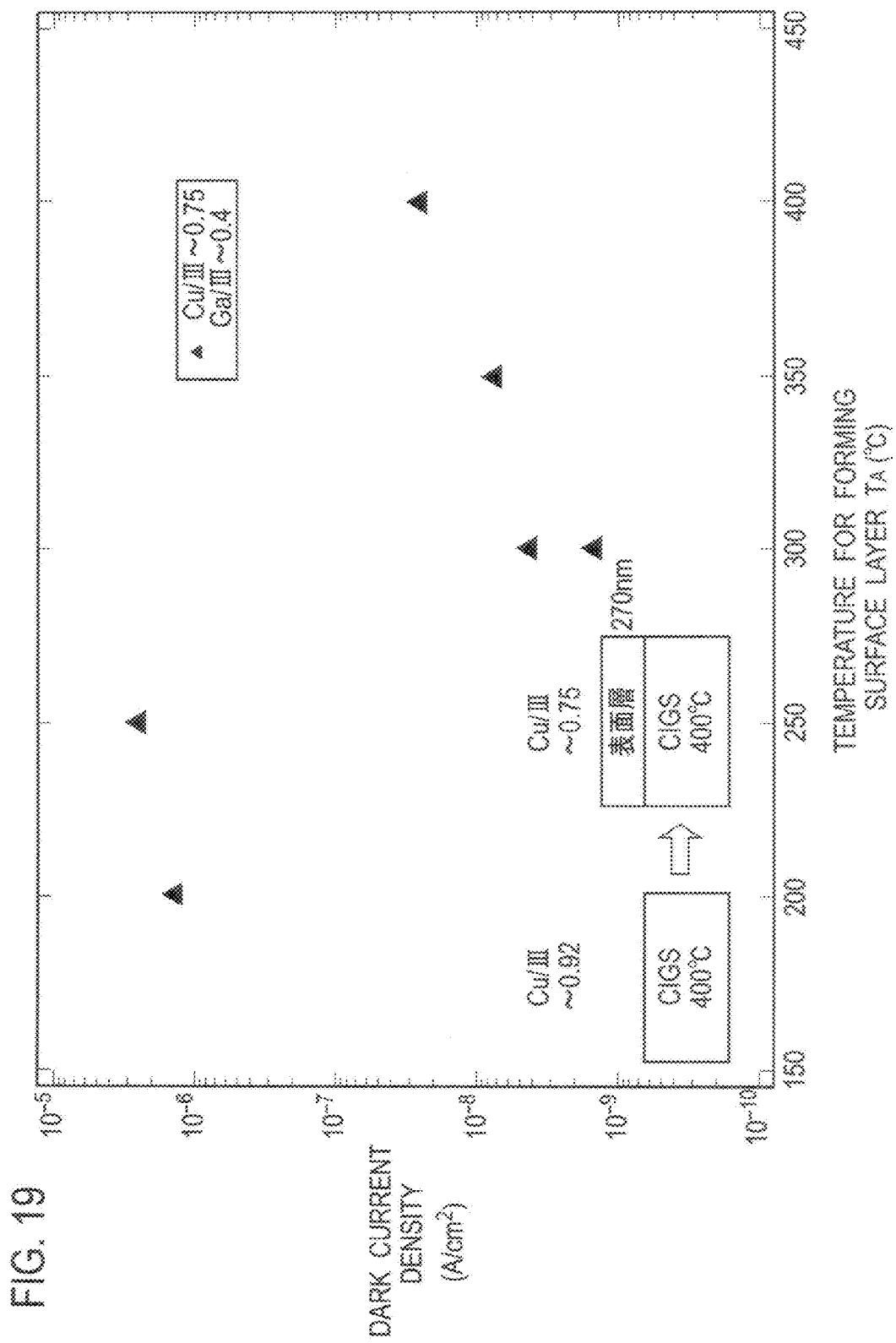

[FIG. 19] Relationship between the dark current and temperature for forming surface layer $T_A$ of the photoelectric conversion device formed by the fabrication method for the photoelectric conversion device according to the first embodiment of the present invention

[FIG. 20]

(a) An SCN photograph of the photoelectric conversion unit formed by the fabrication method for the photoelectric conversion device according to the comparative example of the first embodiment of the present invention, and (b) An explanatory diagram of FIG. 20(a)

[FIG. 21]

(a) An SCN photograph of the photoelectric conversion unit formed by the fabrication method for the photoelectric conversion device according to the first embodiment of the present invention, and (b) An explanatory diagram of FIG. 21(a)

Figure 22:
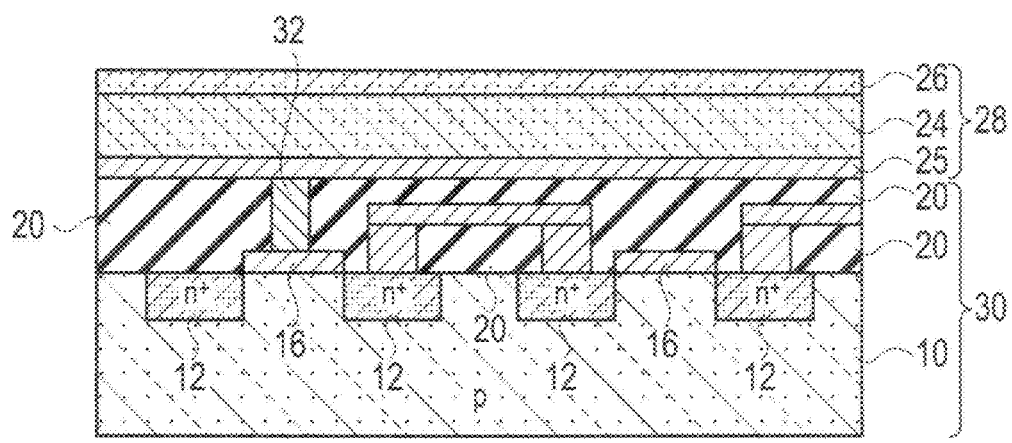

[FIG. 22] A schematic cross-sectional configuration chart of one pixel part of the solid state imaging device which composes by applying the photoelectric conversion device according to the first embodiment of the present invention

[FIG. 23]

(a) A circuit configuration diagram of one pixel of the solid state imaging device which composes by applying the photoelectric conversion device according to the first embodiment of the present invention, and (b) A circuit configuration diagram of one pixel of the solid state imaging device related to the comparative example of the present invention

Figure 24:
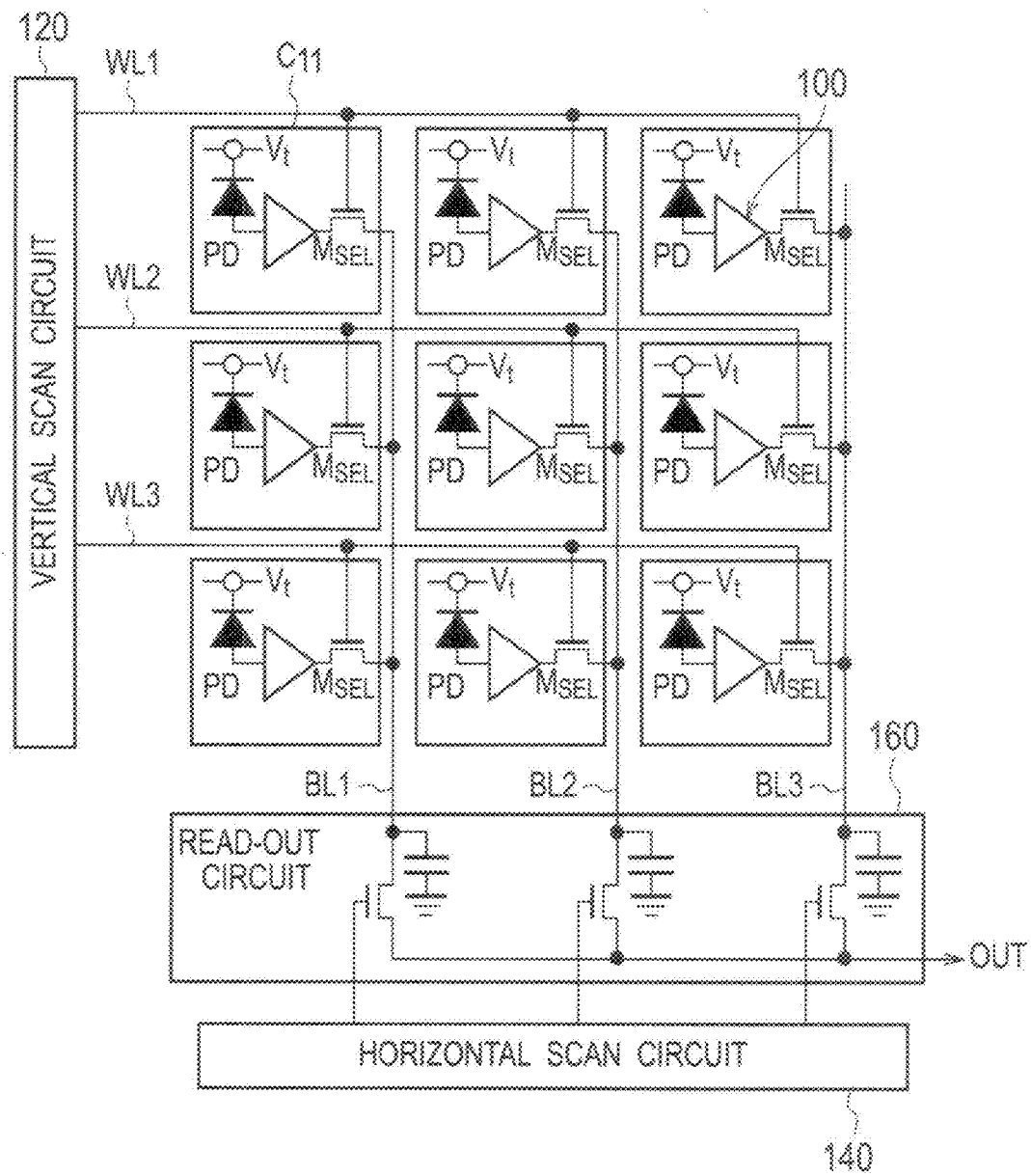

[FIG. 24] A schematic circuit block configuration diagram of the solid state imaging device which composes by applying the photoelectric conversion device according to the first embodiment of the present invention

Figure 25:
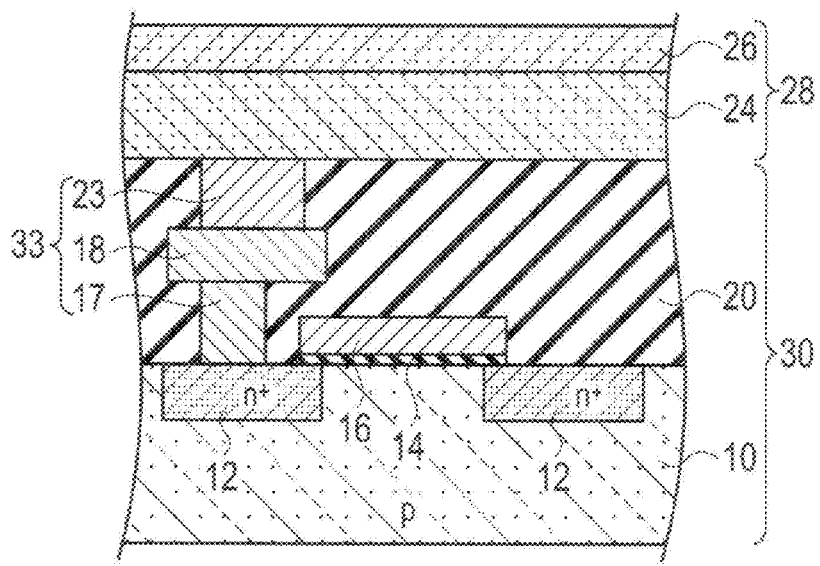

[FIG. 25] A schematic cross-sectional configuration chart of a photoelectric: conversion device according to a second embodiment of the present invention

Figure 26:
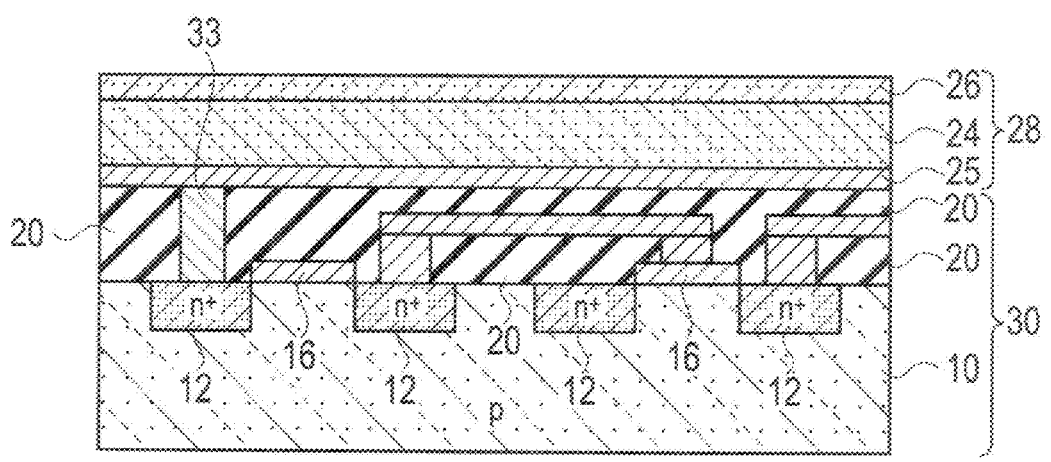

[FIG. 26] A schematic cross-sectional configuration chart of one pixel part of the solid state imaging device which composes by applying the photoelectric conversion device according to the second embodiment of the present invention

REFERENCE SIGNS LIST

1: Package substrate;
2: Bonding pad;
3: Aluminum electrode layer;
4: Bonding pad connecting unit;
5: Pixel;
10: Semiconductor substrate;
12: Source/drain diffusion layer;
14: Gate insulating film;
16: Gate electrode;
17: VIA0 electrode;
18: Wiring layer;
20: Interlayer insulating film;
22 and 23: VIA1 electrode;
24: Compound semiconductor thin film (CIGS film);
25: Lower electrode layer;
26: Transparent electrode layer;
28: Photoelectric conversion unit;
30: Circuit unit;
32 and 33: VIA electrode;
34: Isolation region;
36: Buffer layer;
120: Vertical scan circuit;
140: Horizontal scan circuit;
160: Read-out circuit;
241: P type CIGS layer;
242: i type CIGS layer (high resistivity layer);
261: Semi-insulating layer (iZnO layer);
262: Upper electrode layer (nZnO layer);
$WL_i$ (i=1 to m, and m is an integer): Word line; and
$BL_j$ (j=1 to n, and n is an integer): Bit line.

DESCRIPTION OF EMBODIMENTS

Next, embodiments of the invention will be described with reference to drawings. In the description of the following drawings, the same or similar reference numeral is attached to the same or similar part. However, a drawing is schematic and it should care about differing from an actual thing. Drawings are schematic, not actual, and may be inconsistent in between in scale, ratio, etc.

The embodiment shown in the following exemplifies the device and method for materializing the technical idea of this invention, and this technical idea of the invention does not specify assignment of each component parts, etc. as the following. Various changes can be added to the technical idea of this invention in scope of claims.

[First Embodiment]
(Plane Pattern Configuration)

Figure 1:
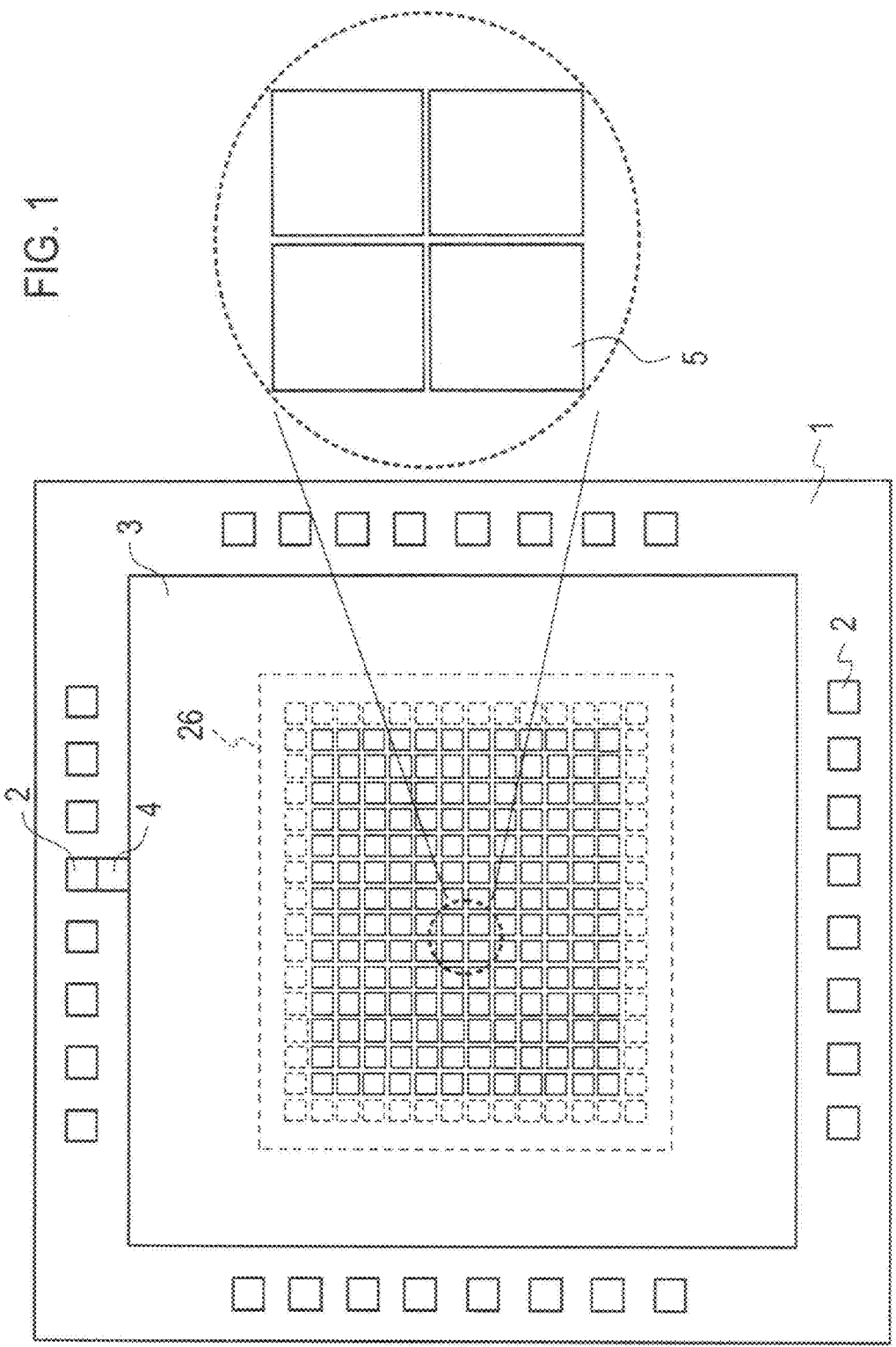
[FIG. 1] A whole schematic plane pattern configuration diagram of a solid state imaging device composed by arranging a photoelectric conversion device according to a first embodiment of the present invention in two dimensions

As shown in FIG. 1, a whole schematic plane pattern configuration of a solid state imaging device composed by arranging a photoelectric conversion device according to a first embodiment of the present invention in two dimensions includes: a package substrate 1; a plurality of bonding pads 2 disposed on the periphery on the package substrate 1; and an aluminum electrode layer 3 which is connected with the bonding pad 2 and a bonding pad connecting unit 4, and is connected to a transparent electrode layer 26 disposed on a pixel 5 of the solid state imaging device, on the periphery of the solid state imaging device. That is, the aluminum electrode layer 3 covers an end region of the transparent electrode layer 26, and the aluminum electrode layer 3 is connected to the one bonding pad 2 via the bonding pad connecting unit 4. The pixel 5 is disposed at matrix shape in the example of FIG. 1.

(Photoelectric Conversion Device)

Figure 2:
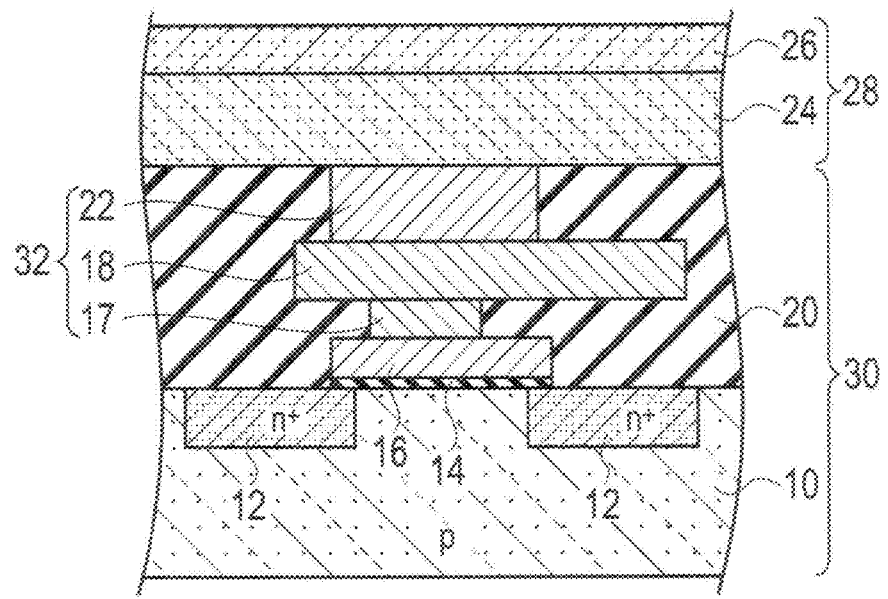
[FIG. 2] A schematic cross-sectional configuration chart of the photoelectric conversion device according to the first embodiment of the present invention

As shown in FIG. 2, a schematic cross-section structure of the photoelectric conversion device according to the first embodiment of the present invention includes a circuit unit 30 formed on a substrate, and a photoelectric conversion unit 28 placed on the circuit unit 30. In addition, in FIG. 2, illustration of a lower electrode layer 25 and a buffer layer 36 is omitted.

The photoelectric conversion device shown in FIG. 2 includes: a circuit unit 30 formed on the semiconductor substrate 10; a lower electrode layer 25 disposed on the circuit unit 30; a compound semiconductor thin film 24 of a chalcopyrite structure disposed on the lower electrode layer 25; a buffer layer 36 disposed on the compound semiconductor thin film 24; and a transparent electrode layer 26 disposed on the buffer layer 36.

Moreover, the lower electrode layer 25, the compound semiconductor thin film 24, the buffer layer 36, and the transparent electrode layer 26 are laminated one after another on the circuit unit 30.

In the photoelectric conversion device according to the first embodiment, reverse bias voltage is applied between the transparent electrode layer 26 and the lower electrode layer 25, and the multiplication of electric charge generated by photoelectric conversion is made to generate by impact ionization within the compound semiconductor thin film 24 of chalcopyrite structure.

The circuit unit 30 includes a transistor by which the lower electrode layer 25 is connected to the gate.

The circuit unit 30, and the lower electrode layer 25, the compound semiconductor thin film 24, the buffer layer 36, and the transparent electrode layer 26 laminated one after another on the circuit unit 30 may be integrated.

In the photoelectric conversion device shown in FIG. 2, the compound semiconductor thin film 24 of chalcopyrite structure is formed by $Cu(In_x, Ga_{1-x})Se_2$ (where $0<=X<=1$).

As the lower electrode layer 25, molybdenum (Mo), niobium (Nb), tantalum (Ta), tungsten (W), etc. can be used, for example.

As a formation material of the buffer layer 36, CdS, ZnS, ZnO, ZnMgO, ZnSe, $In_2S_3$, etc. can be used, for example.

The transparent electrode layer 26 is composed of a non-doped ZnO film (i-ZnO) disposed on the compound semiconductor thin film 24, and an n type ZnO film disposed on the non-doped ZnO film (i-ZnO).

The photoelectric conversion device shown in FIG. 2 can also be composed as photosensor having sensitivity also in a near infrared optical wavelength region.

Moreover, the compound semiconductor thin film 24 includes the surface with the high resistivity layer (i type CIGS layer).

The circuit unit 30 may include a Complementary Metal oxide Semiconductor Field Effect Transistor (CMOSFET), for example.

In FIG. 2, an n channel MOS transistor which composes a part of CMOS is shown in the circuit unit 30, and the circuit unit 30 includes: a semiconductor substrate 10; source/drain regions 12 formed in the semiconductor substrate 10; a gate insulating film 14 disposed on the semiconductor substrate 10 between the source/drain regions 12; a gate electrode 16 disposed on the gate insulating film 14; a VIA0 electrode 17 disposed on the gate electrode 16; a wiring layer 18 for gates disposed on the VIA0 electrode 17; and The VIA1 electrode 22 disposed on the wiring layer 18.

All of the gate electrode 16, the VIA0 electrode 17, the wiring layer 18, and the VIA1 electrode 22 are formed in an interlayer insulating film 20.

A VIA electrode 32 disposed on the gate electrode 16 is formed of the VIA0 electrode 17, the wiring layer 18 disposed on the VIA0 electrode 17, and the VIA1 electrode 22 disposed on the wiring layer 18.

In the photoelectric conversion device shown in FIG. 2, the gate electrode 16 and the photoelectric conversion unit 28 of a n channel MOS transistor which compose a part of CMOS are electrically connected by the VIA electrode 32 disposed on the gate electrode 16.

Since an anode of a photo diode which composes the photoelectric conversion unit 28 is connected to the gate electrode 16 of the n channel MOS transistor, optical information detected in the photo diode is amplified by the aforementioned n channel MOS transistor.

In addition, the circuit unit 30 can also be formed by the thin film transistor of the CMOS structure formed on a thin film formed on a glass substrate, for example.

Figure 3:
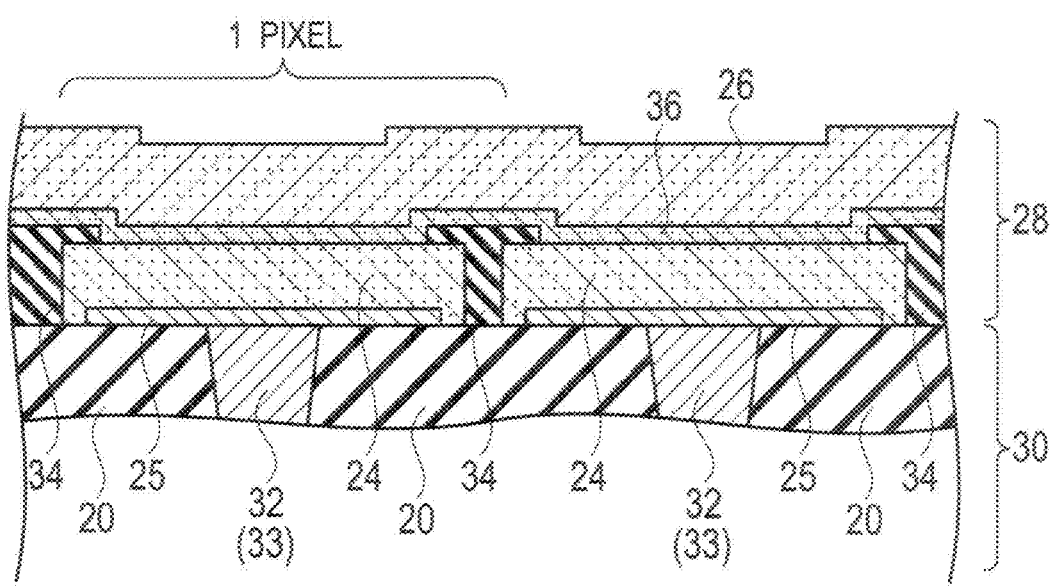
[FIG. 3] A more detailed cross-sectional configuration chart including adjoining pixels of the solid state imaging device composed by arranging the photoelectric conversion device according to the first embodiment in two dimensions

FIG. 3 shows more detailed cross-sectional configuration chart including adjoining pixels of the solid state imaging device composed by arranging the photoelectric conversion device according to the first embodiment in two dimensions.

As clearly from FIG. 3, the compound semiconductor thin film 24 disposed on the lower electrode layer 25 and the lower electrode layer 25 is separated each other via the isolation region 34 formed with the interlayer insulating film between adjoining pixel cells. Moreover, the buffer layer 36 disposed on the compound semiconductor thin film 24 is formed in one piece all over the semiconductor substrate surface. Also, the transparent electrode layer 26 is formed in one piece all over the semiconductor substrate surface, and is performed in common electrically.

In addition, the width of the compound semiconductor thin film 24 and the width of the lower electrode layer 25 may be equivalent, or more for details, as shown in FIG. 3, it may set to so that the width of the compound semiconductor thin film 24 may become larger than the width of the lower electrode layer 25.

According to the above-mentioned configuration, the void and pinhole which are occurred in an underlying CIGS thin film are embedded by a semi-insulating layer and leak can be prevented, by providing a non-doped ZnO film (i-ZnO) as the transparent electrode layer 26. Therefore, the dark current of the pn junction interface can be reduced by applying the non-doped ZnO film (i-ZnO) as a thick film.

Also, the configuration which has the buffer layer 36 as an embodiment is mentioned above. Although the leakage current can be reduced by the buffer layer 36, the present invention is not limited to the configuration. It may be the configuration of providing an electrode layer without the buffer layer on the compound semiconductor thin film (CIGS) layer.

(Multiplication Mechanism of Photoelectric Conversion Unit)

Figure 4:
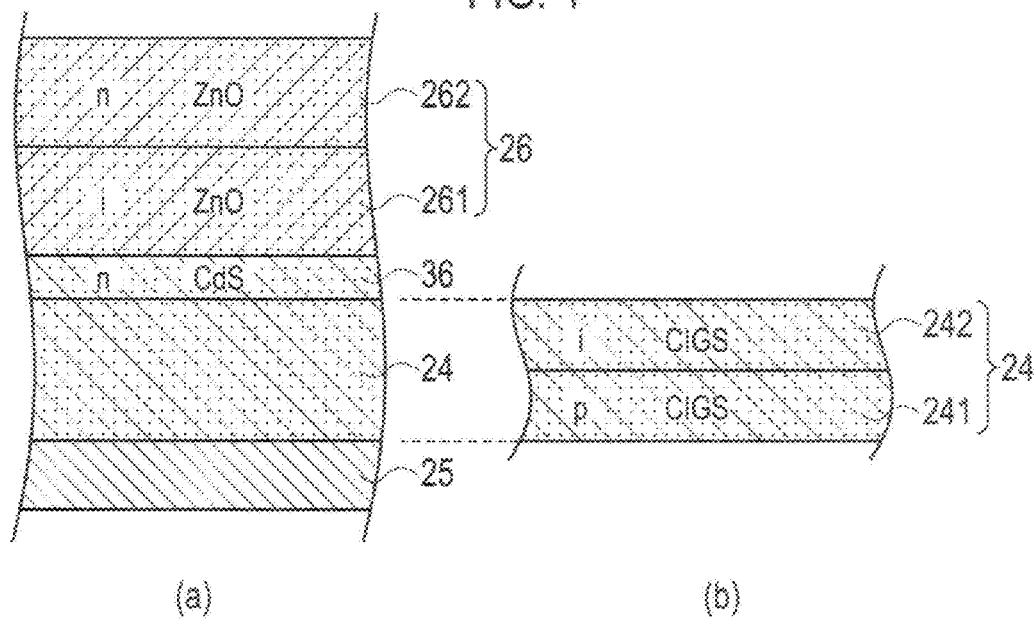
[FIG. 4] In the photoelectric conversion device according to the first embodiment of the present invention,
(a) a schematic cross-sectional configuration chart of a photoelectric conversion unit, and
(b) a schematic cross-sectional configuration chart of a compound semiconductor thin film part

As shown in FIG. 4(a), the photoelectric conversion unit 28 of the photoelectric conversion device according to the first embodiment includes: a lower electrode layer 25; a compound semiconductor thin film 24 disposed on the lower electrode layer 25; a buffer layer 36 disposed on the compound semiconductor thin film 24; a semi-insulating layer (iZnO layer) 261 disposed on the buffer layer 36; and an upper electrode layer (nZnO layer) 262 disposed on the semi-insulating layer (iZnO layer) 261.

According to the above-mentioned configuration, the void and pinhole which are occurred in the underlying CIGS thin film 24 are embedded by the semi-insulating layer and the leak can be prevented by forming the semi-insulating layer 261 which is composed of a non-doped ZnO layer as the transparent electrode layer 26. However, not only the configuration, but the ZnO layer composed of the semi-insulating layer (iZnO layer) 261 and the upper electrode layer (nZnO layer) 262 can also be composed only of the upper electrode layers (nZnO layer) 262.

Moreover, an i type CIGS layer (high resistivity layer) 242 is formed in the interface which contacts the buffer layer 36 of the compound semiconductor thin film 24. As a result, since the underlying CIGS thin film 241 is a p type, the pin junction composed of the p type CIGS layer 241, the i type CIGS layer 242, and the n type buffer layer (CdS) 36 is formed as shown in FIG. 4(a) and FIG. 4(b).

The leak due to the tunnel current which occurs when the conductive upper electrode layer 262 is directly contacted to the CIGS thin film 24 can be prevented by the structure of the upper electrode layer (nZnO layer) 262/semi-insulating layer (iZnO layer) 261/buffer layer 36/i type CIGS layer 242/p type CIGS layer 241/lower electrode layer 25. Also, the dark current can be reduced by setting the semi-insulating layer 261 composed of the non-doped ZnO layer to thick film.

The thickness of the upper electrode layer 262 is about 500 nm, for example, the thickness of the semi-insulating layer 261 is about 200 nm, for example, the thickness of the buffer layer 36 is about 100 nm, for example, the thickness of the i type CIGS layer 242 is about 200 nm to 600 nm, for example, the thickness of the p type CIGS layer 241 is about 1 to 2 μm, for example, and the thickness of the lower electrode layer 25 is about 600 nm, for example. The whole thickness from the lower electrode layer 25 to the transparent electrode layer 26 is about 3 μm, for example.

Moreover, as the transparent electrode layer 26, other electrode materials are also applicable. For example, an ITO film, a tin oxide ($SnO_2$) film, or an indium oxide ($In_2O_3$) film can be used.

In the photoelectric conversion unit 28 of the photoelectric conversion device according to the first embodiment of the present invention, FIG. 5(a) shows a configuration diagram of the compound semiconductor thin film which forms pin junction, and FIG. 5(b) shows a field strength distribution diagram corresponding to FIG. 5(a).

Figure 6:
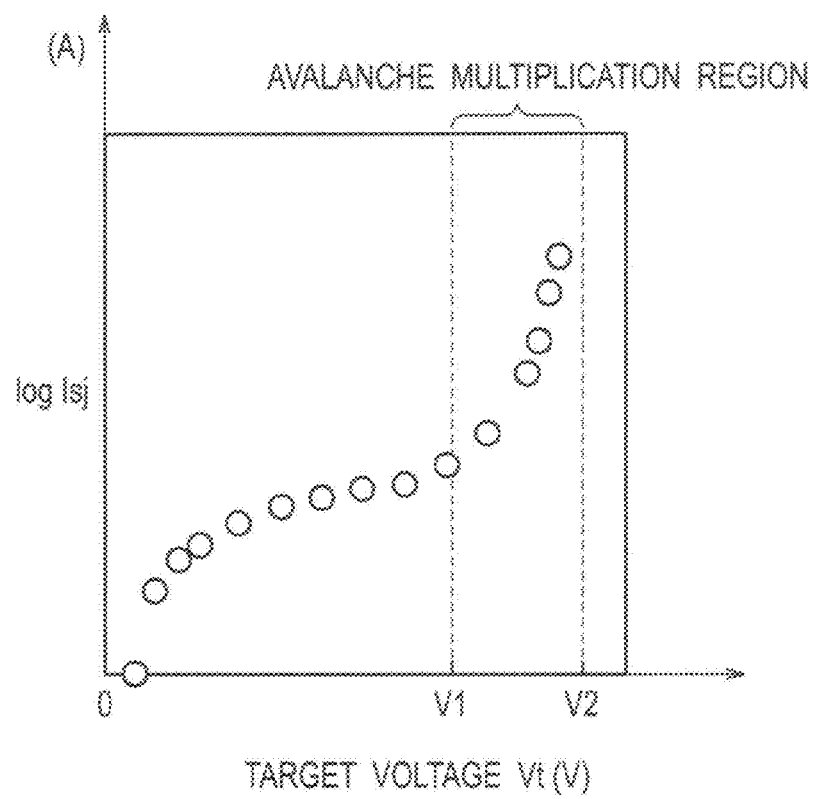
[FIG. 6] A characteristics diagram showing a relationship between target voltage $V_t(V)$ and a signal current $I_{sj}$ (A) which are applied between an upper electrode layer and a lower electrode layer in the photoelectric conversion device according to the first embodiment of the present invention

Moreover, FIG. 6 is a diagram for explaining avalanche multiplication, a vertical axis shows the signal current $I_{sj}$ (A), and a horizontal axis shows target voltage $V_t$(V) applied between the upper electrode layer and the lower electrode layer. In the avalanche multiplication, if the target voltage is made to increase, the signal current will increase dramatically. Accordingly, the sensitivity of the sensor can be improved.

In the photoelectric conversion device according to the first embodiment, the target voltage $V_t$ equivalent to a reverse bias voltage of pin junction is applied between the upper electrode layer 262 composed of n type ZnO, and the lower electrode layer 25 by which ohmic contact was performed to the p type CIGS layer 241.

Figure 5:
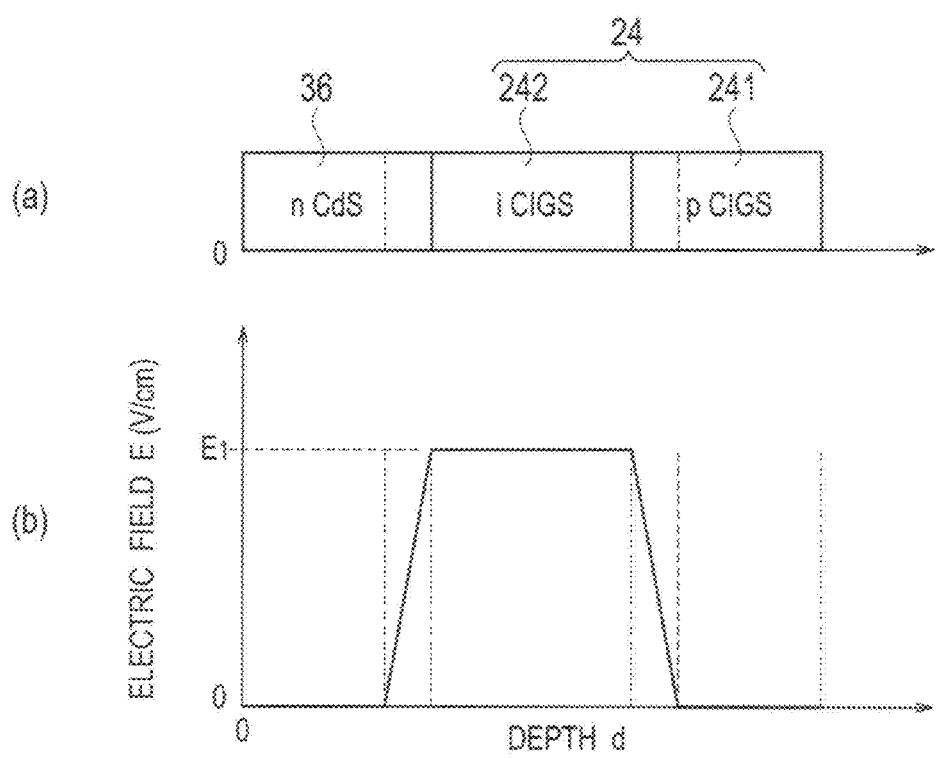
[FIG. 5] In the photoelectric conversion unit formed by a fabrication method for the photoelectric conversion device according to the first embodiment of the present invention,
(a) A configuration diagram of the compound semiconductor thin film which forms pin junction, and
(b) A field strength distribution diagram corresponding to FIG. 4(a)

Since the peak value E1 of the electric field strength E (V/cm) is obtained in the interface of pin junction as shown in FIG. 5, the strong electric field is generated in the inside of the compound semiconductor thin film 24.

In the above-mentioned structure, the value of the peak value E1 of the electric field strength E (V/cm) is about $4 \times 10^4$ to $4 \times 10^5$ (V/cm). The value of E1 is changed according to the CIGS composition and the film thickness of the compound semiconductor thin film 24.

In this case, the avalanche multiplication region in FIG. 6 is about 10V region as the target voltage $V_t$. On the other hand, in order to obtain avalanche multiplication, about 100V is necessary in the case of the usual silicone device.

Figure 7:
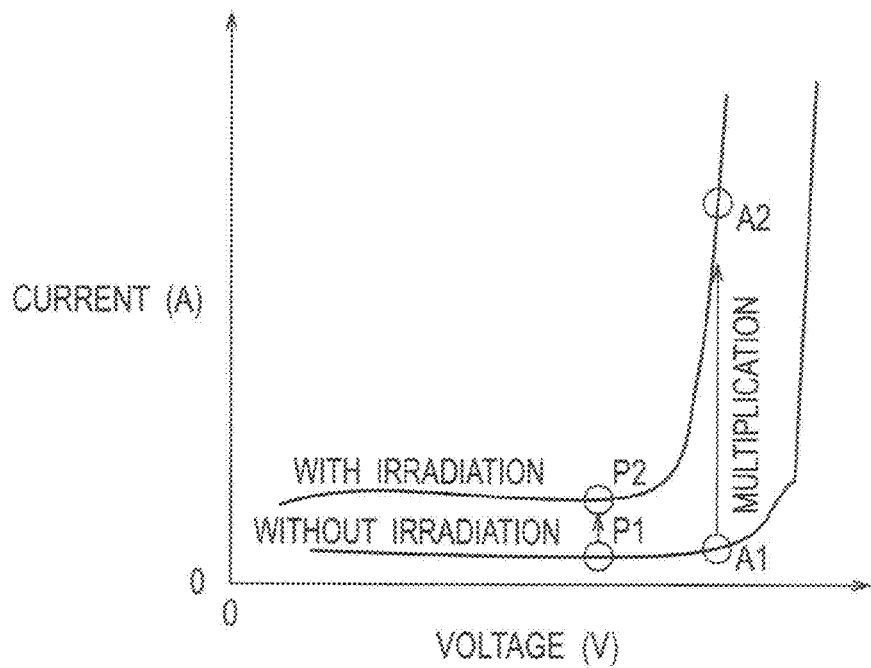
[FIG. 7] A schematic diagram of current-voltage characteristics for explaining a multiplication phenomenon in the case with light irradiation and in the case without light irradiation, in the photoelectric conversion device according to the first embodiment of the present invention

Moreover, in the photoelectric conversion device according to the first embodiment, FIG. 7 shows current-voltage characteristics for explaining a multiplication phenomenon in the case with light irradiation and in the case without light irradiation. As clearly from FIG. 7, in the case with light irradiation P2 and in the case without light irradiation P1, the change of the current value of is slight when the comparatively low target voltage $V_t$ is applied. On the other hand, in the case with light irradiation A2 and in the case without light irradiation A1, the change of the current value of is very remarkable in the state where the high voltage is applied relatively and the avalanche multiplication operation may occur. The dark current in the case without light irradiation is substantially of the same grade, comparing P1 and A1. Therefore, in the photoelectric conversion device according to the first embodiment, it is obvious that the S/N ratio is also improved.

(Formation Process of Compound Semiconductor Thin Film of Chalcopyrite Structure)

The compound semiconductor thin film of chalcopyrite structure which functions as the optical absorption layer can be formed by the vacuum evaporation method called Physical Vapor Deposition (PVD), a sputtering technique, or Molecular Beam Epitaxy (MBE) on a semiconductor substrate or a glass substrate in which the circuit unit 30 is formed. In this case, the PVD shall mean the method of forming a film by making the primary material evaporated in the vacuum deposit.

When using the vacuum evaporation method, it is made to vapor-deposit on the substrate in which the circuit unit 30 is formed, by making each component (Cu, In, Ga, Se, S) of the compound into a vacuum evaporation source independently.

In the sputtering method, a chalcopyrite compound is used as a target or each the component is independently used as a target.

In addition, since the substrate is heated to high temperature when forming the compound semiconductor thin film of chalcopyrite structure on the glass substrate in which the circuit unit 30 is formed, the stoichiometry shift may occur by separation of a chalcogenide element. In this case, it is preferable by performing heat treatment for about 1 to several hours at the temperature of 400 to 600 degrees C. in the steamy atmosphere of Se or S after film formation in order to fill up Se or S (a selenium processing or a sulfuration processing).

Next, first of all, a fabrication method will be explained about a comparative example of the present invention for reference.

A formation process of the compound semiconductor thin film of the chalcopyrite structure applied to the fabrication method for the photoelectric conversion device according to the comparative example of the present invention is shown as a three-step method shown in FIG. 8, for example.

When forming the CIGS thin film ($Cu(In_X, Ga_{1-X})Se_2$ (where $0<=X<=1$)) of p type with which composition control is achieved, using the sputtering method, it is performed by dividing into three steps, a first step, a second step, and a third step, for example, as shown in FIG. 8. FIG. 8(a) shows the substrate temperature in each step and the component at the time of forming the film by the sputtering technique. FIG. 8(b) shows the composition ratio in each step (Cu/group III (In+Ga)).

First of all, in the first step, the composition ratio of (Cu/group III (In+Ga)) is remained 0, in the group III element is a rich state.

Next, shifting to the second step, it shifts to the rich state of Cu element of (Cu/group III (In+Ga)) whose composition ratio is from 0 to not less than 1.0.

Next, shifting to the third step, it shifts from a rich state of Cu element of (Cu/group III (In+Ga)) whose composition ratio is more than 1.0 to a rich state of group III element of (Cu/group III (In+Ga)) whose composition ratio is not more than 1.0. Then, the compound semiconductor thin film ($Cu(In_X, Ga_{1-X})Se_2$ (where $0<=X<=1$)) of desired chalcopyrite structure is formed. As mentioned above, in the present embodiment, the formation of the compound semiconductor thin film 24 is performed not more than about 400 degrees C. When the substrate temperature is high enough, each constituent element may be diffused mutually.

Figure 9:
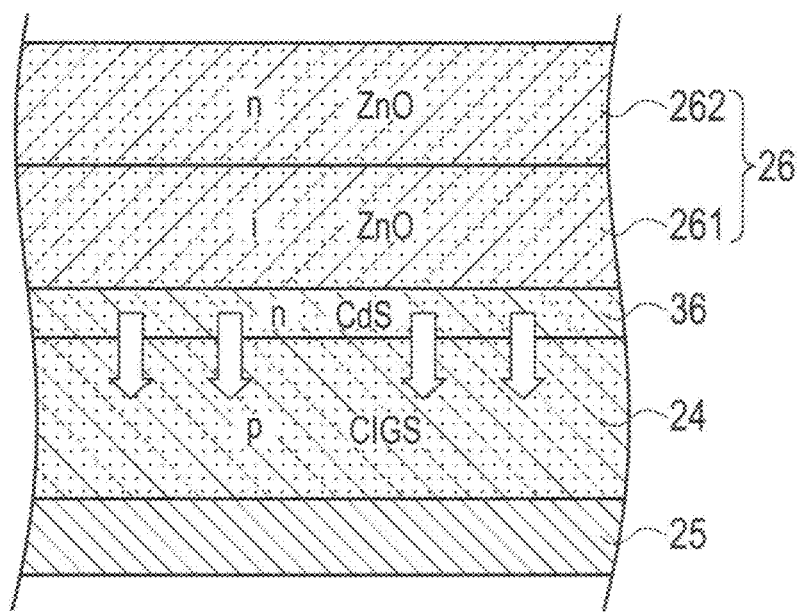
[FIG. 9] A schematic cross-sectional configuration chart of the photoelectric conversion unit, in the photoelectric conversion device formed by the fabrication method for the photoelectric conversion device according to the comparative example of the present invention

FIG. 9 shows a schematic cross-sectional configuration chart of the photoelectric conversion unit formed by the fabrication method for the photoelectric conversion device according to the comparative example of the present invention. According to the fabrication method for the photoelectric conversion device according to the comparative example of the present invention, since diffusion of Cd from the buffer layer 36 appears remarkably, the n type CIGS layer (not shown) formed by the diffusion layer of Cd in the buffer layer 36 side of the compound semiconductor thin film 24.

Figure 10:
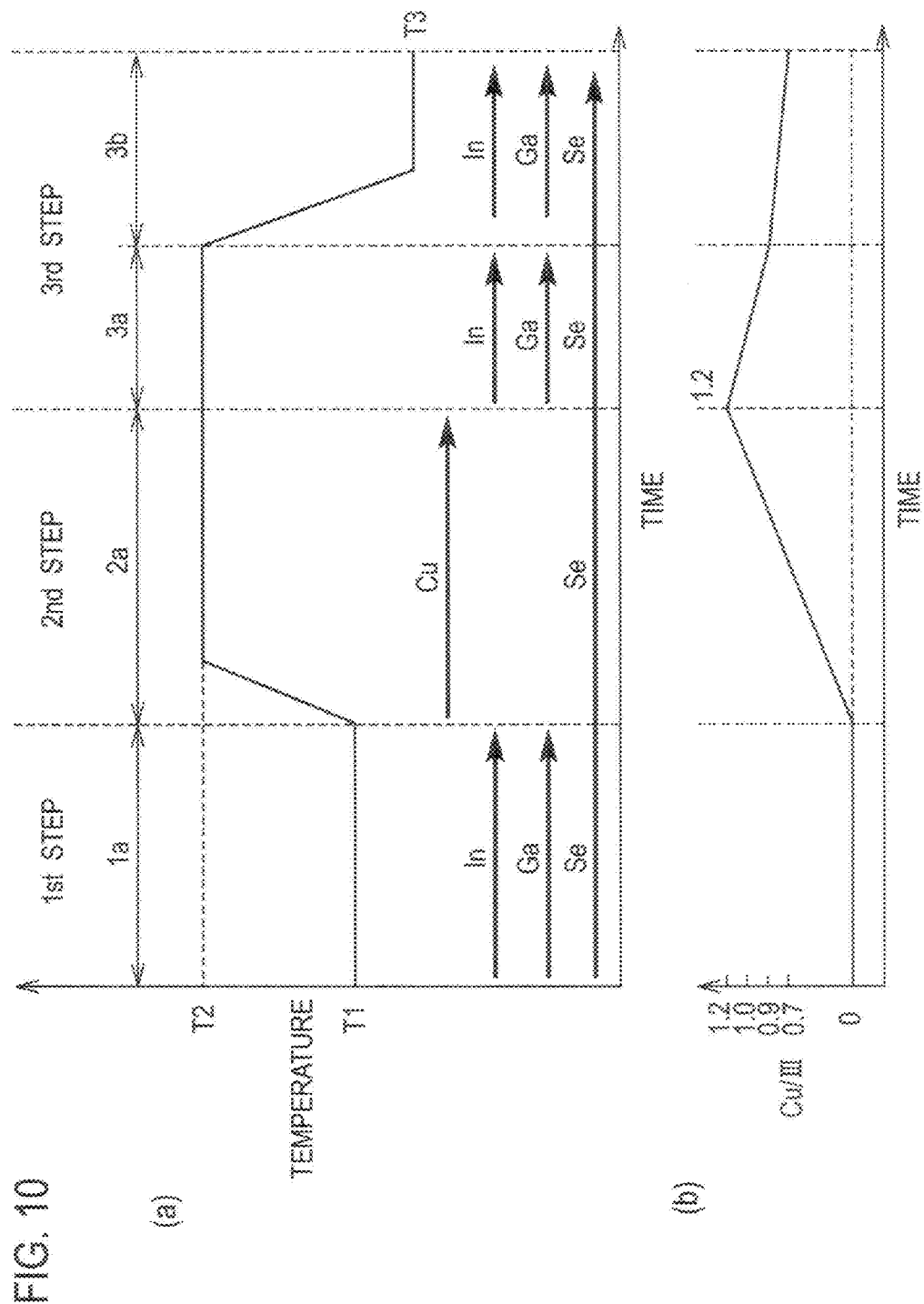
[FIG. 10] A detailed explanation diagram of the formation process of the compound semiconductor thin film of chalcopyrite structure, in the fabrication method for the photoelectric conversion device according to the first embodiment of the present invention, (a) A diagram showing a component at the time of forming membranes and a substrate temperature in each stage, and (b) A diagram showing a composition ratio of (Cu/(In+Ga)) in each stage.

FIG. 10 is a detailed explanation diagram of the formation process of the compound semiconductor thin film of chalcopyrite structure, and shows the component at the time of forming films by an evaporation method and the substrate temperature in each step, in the fabrication method for the photoelectric conversion device according to the first embodiment. The Film formation may be performed by a sputtering technique.

As shown in FIG. 10, the fabrication method for the photoelectric conversion device according to the first embodiment holds the substrate temperature to the first temperature T1 includes: the first step (period 1a) that maintain the composition ratio of (Cu(In+Ga)) to 0 in which the group III element is the rich state; the second step (period 2a) that holds the substrate temperature from the first temperature T1 to the second temperature T2 higher than the first temperature T1, and shifts the composition ratio of (Cu/(In+Ga)) to the rich state of Cu element which is more than 1.0; and the third step that shift from the rich state of Cu element of the composition ratio of (Cu/(In+Ga)) which is more than 1.0 to the rich state of group III element of the composition ratio of (Cu/(In+Ga)) which is not more than 1.0. The third step forms the compound semiconductor thin film of chalcopyrite structure by having the first period (period 3a) that holds the substrate temperature to the second temperature T2, and the second period (period 3b) that holds the substrate temperature from the second temperature T2 to the third temperature T3 lower than the first temperature T1.

Moreover, the compound semiconductor thin film of chalcopyrite structure is formed by $Cu(In_X, Ga_{1-X})Se_2$ (where $0<=X<=1$).

Moreover, the third temperature T3 is not less than about 300 degrees C. and not more than degree 400 degrees C., for example.

Moreover, the second temperature is not more than about 550 degrees C., for example.

Moreover, in the third step, it is effective setting (Cu/(In+Ga)) at the time of completing of the first step (period 3a) as a range of about 0.5 to 1.3, for example, and effective also setting (Cu/(In+Ga)) at the time of completing of the second step (period 3b) as not more than 1.0 value.

Moreover, the compound semiconductor thin film 24 has the i type CIGS layer 242 on the surface.

In the fabrication method for the photoelectric conversion device according to the first embodiment, although the first step and the second step are the same as the comparative example shown in FIG. 8(a), and the third step is separated into two steps and is a high temperature process step of the temperature T2 during the 3a period, it shifts to the low temperature process step of the temperature T3, and the i type CIGS layer 242 is positively formed on the surface of the compound semiconductor thin film 24 in the 3b period. The substrate temperature is 300 degrees C. to 400 degrees C., for example, and shall be about 300 degrees C.

In the fabrication method for the photoelectric conversion device according to the first embodiment, the vacuum evaporation of each component element is not vapor-deposited at the same time, but is separated and performed in three steps, and distribution of each component element in the film can be controlled to some extent. The beam flux of In element and Ga element is used for control of the bandgap of the compound semiconductor thin film 24. On the other hand, Cu/group III (In+Ga) ratio can be used for control of the Cu density in the CIGS film. Setting of Cu/group III (In+Ga) ratio is relatively easy. Control of film thickness is also easy. Se is always supplied in fixed quantity.

Since setting of Cu/group III (In+Ga) ratio is relatively easy, in the third step, Cu/group III (In+Ga) ratio is reduced, and the i type CIGS layer 242 can be easily formed on the surface of the compound semiconductor thin film 24 with effective controllability of film thickness. It is considered that it functions as the i layer since the i type CIGS layer 242 has a low density of Cu which adjusts the carrier density in the film and there are few carriers.

In addition, although the example which continues at the three-step method of FIG. 8, and performs the low-temperature step 3b was explained with reference to FIG. 10 above, the present invention is not limited to the configuration. For example, the process can once be completed after performing the three-step method, Cu fraction can be reduced with performing the temperature change to temperature as shown in the period 3b of FIG. 10 after that, and a desired CIGS surface layer can also be formed. Although the three-step method was explained as the example, the present invention is also not limited to the configuration. For example, the present invention can also be performed using a bilayer method. The bilayer method is a method of forming the CIGS film by the evaporating method, a sputtering technique, etc. using four elements of Cu, In, Ga, and Se in the first step, and using three elements of In, Ga, and Se except for Cu in the following second step. After forming the film by the bilayer method, a desired CIGS surface layer can also be formed by reducing Cu fraction while changing the temperature to temperature as shown in the period 3b of FIG. 10. Of course, the present invention can also be implemented by performing the still more above lower-temperature forming steps to the CIGS thin film created using other method for forming film (a sulfurating method, a seleniding/sulfurating method, a multi-source evaporation method, an in-line type multi-source evaporation method, a high-speed solid phase seleniding method, and a roll two roll (RR) method, an ionization vacuum evaporation and RR method, a multi-source evaporation and RR method, an electrodeposition method, a hybrid process, a hybrid sputtering and RR method, a nano particle printing method, a nano particle printing and RR method, an FASST (registered trademark) process).

Figure 11:
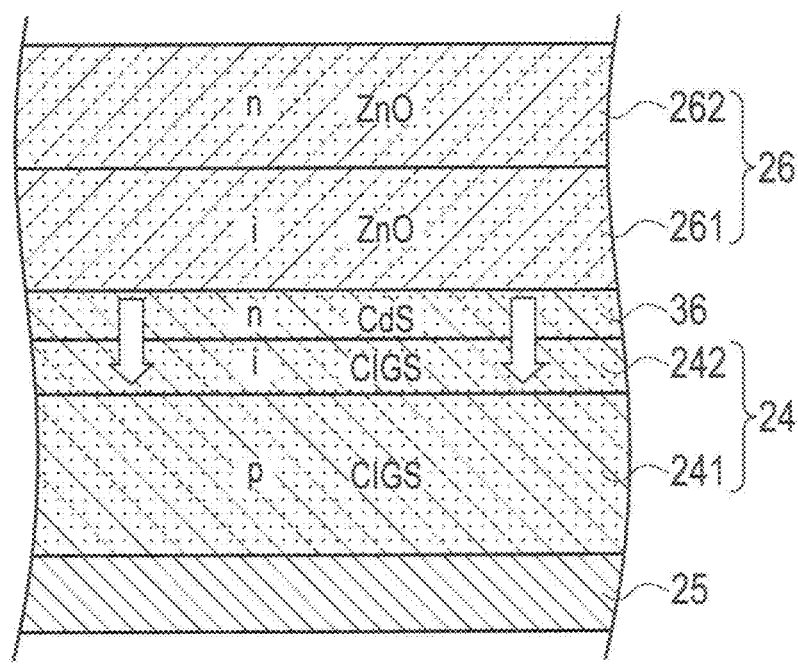
[FIG. 11] A schematic cross-sectional configuration chart of the photoelectric conversion unit, in the photoelectric conversion device formed by the fabrication method for the photoelectric conversion device according to the first embodiment of the present invention

FIG. 11 shows a schematic cross-sectional configuration chart of the photoelectric conversion unit in the photoelectric conversion device formed by the fabrication method for the photoelectric conversion device according to the first embodiment. According to the fabrication method for the photoelectric conversion device according to the 1st embodiment, in the third step in the three-step method mentioned above, Cu/group III (In+Ca) ratio is reduced, and the i type CIGS layer 242 can be easily formed on the surface of the compound semiconductor thin film 24 with the effective controllability of film thickness. It also becomes possible easily to form the thickness of the i type CIGS layer 242 thinly.

Figure 12:
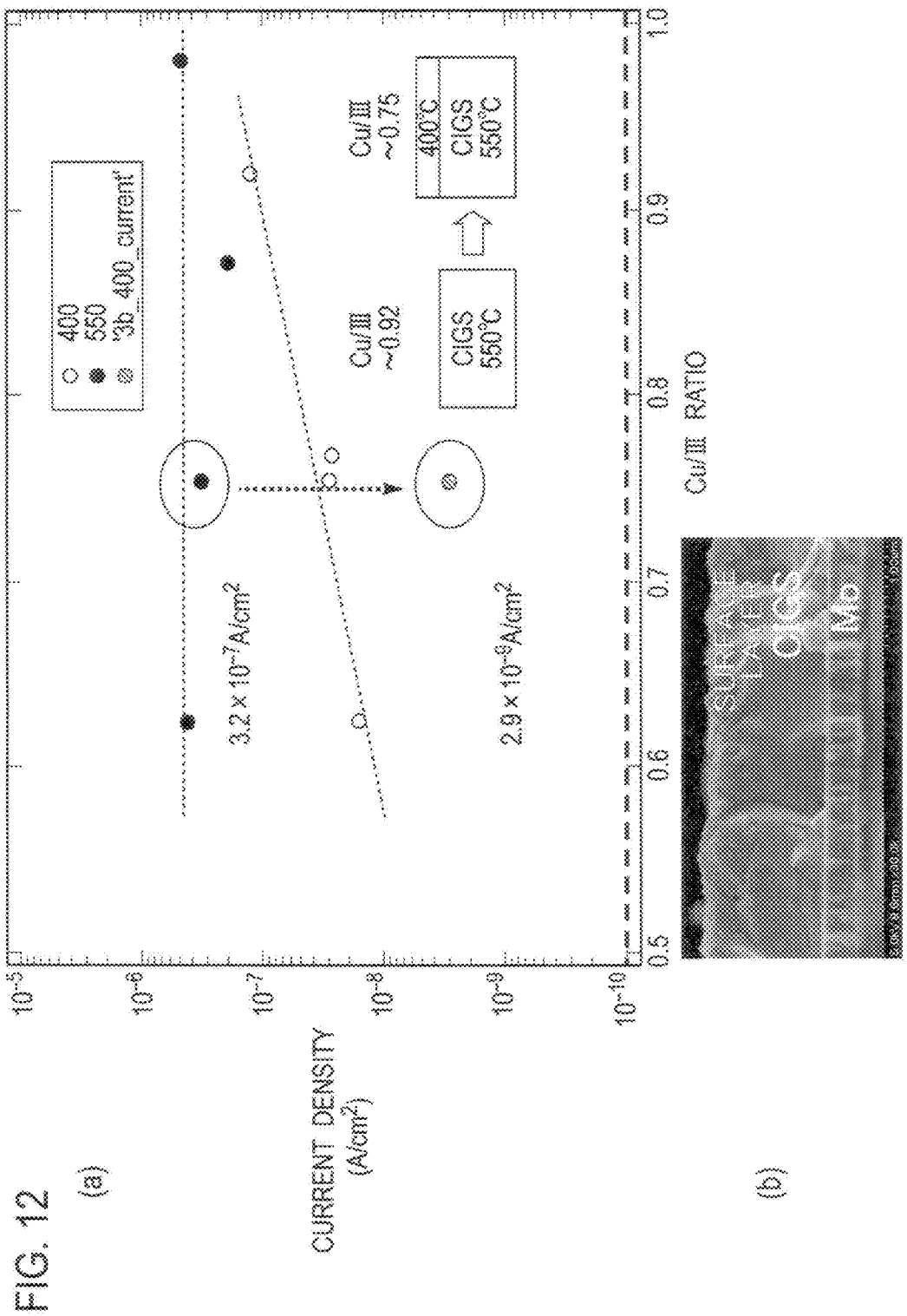
[FIG. 12]

FIG. 12(a) shows the relationship of the dark current density (A/cm$^2$) and Cu/group III ratio as a result which applied the fabrication method for the photoelectric conversion device to test structure. FIG. 12(b) shows the SEM photograph of an example of the test structure which laminated Mo and CIGS on the substrate.

For example, when the substrate temperature of the second step and the third step are about 550 degrees C. as shown in FIG. 8(a), the dark current value is about $3.2 \times 10^{-7}$ (A/cm$^2$), and remarkable dependence is not observed even if it changes Cu/group III ratio.

For example, when the substrate temperature of the second step and the third step are about 400 degrees C. as shown in FIG. 8(a), the dark current value is about $1.5 \times 10^{-8}$ (A/cm$^2$) to about $1 \times 10^{-7}$ (A/cm$^2$), and the tendency which increases gradually is observed as Cu/group III ratio is made to increase to about 0.6 to about 0.92.

On the other hand, as shown in FIG. 10(a), when the substrate temperature of the second step and the period 3a of the third step are about 550 degrees C., and changing Cu/group III ratio to a value smaller than 1.0, and when the substrate temperature of the period 3b of the third step are about 400 degrees C., and changing Cu/group III ratio to a still smaller value, the dark current value becomes about $2.9 \times 10^{-9}$ (A/cm$^2$), and a remarkable downward tendency is observed.

FIG. 13 shows an analysis result by SIMS of the photoelectric conversion unit formed by the fabrication method for the photoelectric conversion device according to the comparative example of the present invention. The second step and the third step of substrate temperature are about 550 degrees C., and Cu/group III ratio is about 0.75 examples. In the analysis result of SIMS shown in FIG. 13, reduction of Cu element is not observed in the surface of the compound semiconductor thin film 24. That is, the surface layer of the compound semiconductor thin film 24 is not formed into i type.

On the other hand, FIG. 14 shows an analysis result by SIMS of the photoelectric conversion unit formed by the fabrication method for the photoelectric conversion device according to the first embodiment. When the substrate temperature is about 400 degrees C. in the second step and the period 3a of the third step, and is about 300 degrees C. in the period 3b of the third step, remarkable reduction of Cu element is observed in 0.75 for Cu/group III ratio and on the surface of the compound semiconductor thin film 24. That is, the surface layer of the compound semiconductor thin film 24 is formed into i type, and the i type CIGS layer 242 is formed. Here, the substrate temperature is set to about 400 degrees C. in the second step, and Cu/group III ratio is set to 0.92. In the period 3b of the third step, the substrate temperature is set to about 300 degrees C., and Cu/group III ratio is set to 0.75. As clearly from FIG. 14, the thickness of the surface layer (i type CIGS layer 242) of the compound semiconductor thin film 24 formed into i type is about 200 nm.

FIG. 15 shows wavelength characteristic of the quantum efficiency which applies a parameter as the value of Cu/group III ratio of the compound semiconductor thin film (CIGS thin film) formed by the fabrication method for the photoelectric conversion device according to the first embodiment. Here, as for the forming condition of the compound semiconductor thin film (CIGS thin film) 24, the substrate temperature is set to about 400 degrees C. in the second step and the period 3a of the third step, and is set to about 300 degrees C. in the period 3b of the third step, as well as the case of FIG. 14.

As clearly from FIG. 15, as for the quantum efficiency, the reduction tendency is observed as the value of Cu/group III ratio of the compound semiconductor thin film 24 reduces such as 0.9, 0.8, 0.6. When mentioning simply, the value of Cu/group III ratio of the compound semiconductor thin film 24 reduces such as 0.9, 0.8, 0.6 corresponding to reduce the Cu fraction by lengthening the period 3b, since the thickness of the surface layer (i type CIGS layer 242) of the compound semiconductor thin film 24 formed into i type becomes thick and the quantum efficiency at the side of short wavelength reduces.

(Photoelectric Conversion Characteristic)

FIG. 16 shows wavelength characteristic of the quantum efficiency of the photoelectric conversion device according to the first embodiment. That is, the photoelectric conversion characteristic of high quantum efficiency is shown reflecting the quantum efficiency of the compound semiconductor thin film (Cu(In$_X$, Ga$_{1-X}$)Se2 (where $0<=X<=1$)) 24 of chalcopyrite structure which functions as an optical absorption layer, in the wide wavelength region from visible light to the near infrared light wavelength region. The quantum efficiency is not less than double compared with the photoelectric conversion characteristic in the case of silicon (Si).

The wavelength region is extensible to about 1300 nm which is a wavelength of the near infrared light wavelength region by changing the composition of the compound semiconductor thin film (Cu(In$_X$, Ga$_{1-X}$)Se$_2$ (where $0<=X<=1$)) 24 of chalcopyrite structure which functions as the optical absorption layer from Cu(InGa)Se$_2$ to Cu(In)Se$_2$.

(Optical Absorption Characteristics)

FIG. 17 shows optical absorption characteristics of the photoelectric conversion device according to the first embodiment. That is, it has strong absorption performance reflecting the optical absorption coefficient characteristics of the compound semiconductor thin film (Cu(In$_X$, Ga$_{1-X}$)Se (where $0<=X<=1$)) 24 of chalcopyrite structure which functions as the optical absorption layer, in the wide wavelength region from visible light to a near infrared light wavelength region.

For example, it is about 100 times the absorption coefficient of silicon (Si) also in the visible light wavelength region, and the absorption performance is extensible to the wavelength of about 1300 nm by changing the composition of the compound semiconductor thin film ($Cu(In_X, Ga_{1-X})Se_2$ (where $0<=X<=1$)) 24 of chalcopyrite structure which functions as the optical absorption layer from $CuGaSe_2$ to $CuInSe_2$.

(Bandgap Energy and In/(In+Ga) Composition Ratio Characteristics)

FIG. 18 shows the bandgap energy of the compound semiconductor thin film ($Cu(In_X, Ga_{1-X})Se_2$ (where $0<=X<=1$)) of chalcopyrite structure and the dependence of In/(In+Ga) composition ratio which are applied to the photoelectric conversion device according to the first embodiment.

As shown in FIG. 18, the bandgap energy of $Cu(Ga)Se_2$ is 1.68 eV, the bandgap energy of $Cu(In, Ga)Se_2$ is 1.38 eV, and the bandgap energy of $Cu(In)Se_2$ is 1.04 eV.

Since In/(In+Ga) composition ratio is controlled for the bandgap energy of the compound semiconductor thin film ($Cu(In_X, Ga_{1-X})Se_2$ (where $0<=X<=1$)) of chalcopyrite structure shown in FIG. 18, and it can be applied variable, the photoelectric conversion wavelength can be applied variable by composition control. For example, for the dark current reduction, it may be applied Ga rich near the top surface and the bottom surface of the CIGS film, and thereby the bandgap energy may be decreased. Moreover, for example, in order to improve the photoelectric conversion efficiency by the near-infrared wavelength band region, it may be applied In rich and band gap energy maybe applied small in the range of the predetermined depth in a CIGS film.

Moreover, in formation of the CIGS surface layer explained above with reference to FIG. 10, if Ga component is increased setting Cu/group III ratio as constant during the surface layer formation, the bandgap energy increases at the surface side and the quantum efficiency at the side of short wavelength can be improved.

FIG. 19 shows the relationship between the dark current ($A/cm^2$) and the temperature for forming surface layer $T_A$ (degrees C.) of the photoelectric conversion device formed by the fabrication method for the photoelectric conversion device according to the first embodiment of the present invention. After forming the p type CIGS layer 241, if temperature for forming surface layer $T_A$ is set to about 300 degrees C. to about 400 degrees C., for example, to form the surface layer (i type CIGS layer 242), the dark current characteristics will improve. Even if it reduces the temperature for forming surface layer $T_A$ from about 400 degrees C. to about 300 degrees C., for example, the dark current characteristics improve. On the other hand, when the temperature for forming surface layer $T_A$ is set to not more than about 300 degrees C., for example, the value of dark current rises and the dark current characteristics deteriorate.

FIG. 20(a) shows an example of Scanning Capacitance Microscope (SCN) photograph of the photoelectric conversion unit of the photoelectric conversion device formed by the fabrication method for the photoelectric conversion device according to the comparative example of the first embodiment. Also, FIG. 20(b) shows an explanatory diagram of FIG. 20(a). The pn junction composed of the p type CIGS layer 241 and the n type buffer layer (CdS) 36 is formed in the photoelectric conversion unit of the photoelectric conversion device according to the comparative example as well as that of FIG. 9.

The region which the dC/dV signal is not outputting in the boundary of the p type CIGS layer 241 and the n type buffer layer (CdS) 36 indicates a bonding depletion layer having the width d1. In the comparative example, the region which becomes n type in the wide range in the p type CIGS layer 241 is observed (not shown in FIG. 20(b)). Such a region is considered to have contributed to the leak path accompanied by the increase in the dark current.

FIG. 21(a) shows an example of SCN photograph of the photoelectric conversion unit of the photoelectric conversion device formed by the fabrication method for the photoelectric conversion device according to the first embodiment. Also, FIG. 21(b) shows an explanatory diagram of FIG. 21(a). The pin junction composed of the p type CIGS layer 241 and the n type buffer layer (CdS) 36 is formed in the photoelectric conversion unit of the photoelectric conversion device according to the first embodiment as well as that of FIG. 11.

The region which the dC/dV signal is not outputting in the boundary of the p type CIGS layer 241 and the n type buffer layer (CdS) 36 indicates a bonding depletion layer having the width d2. According to the first embodiment, most regions reversed to the n type in the p type CIGS layer 241 are not observed. Therefore, it is considered that the leak path accompanied by the increase in the dark current does not exist, but is contributed to the improvement of dark current characteristics.

(Solid State Imaging Device)

A solid state imaging device composed by applying the photoelectric conversion device according to the first embodiment of the present invention includes: a circuit unit 30 formed on the semiconductor substrate 10, and a photoelectric conversion unit 28 disposed on the circuit unit 30 as shown in FIG. 22 as a cross-sectional diagram of one pixel part. In addition, in FIG. 22, illustration of a buffer layer 36 is omitted.

The solid state imaging device shown in FIG. 22 includes: a circuit unit 30 formed on the semiconductor substrate 10; a lower electrode layer 25 disposed on the circuit unit 30 and mutually separated between the pixels adjoining to a column direction or a row direction; a compound semiconductor thin film 24 of the chalcopyrite structure disposed on the lower electrode layer 25 and mutually separated between the pixels adjoining to a column direction or a row direction; a buffer layer 36 disposed on the compound semiconductor thin film 24; a transparent electrode layer 26 disposed on the buffer layer 36. Herein, the column direction is a direction to extend a bit line which reads a signal of each pixel, and a row direction is a direction to intersect perpendicularly in the column direction and to extend a word line which is an address line to each pixel.

The lower electrode layer 25, the compound semiconductor thin film 24, the buffer layer 36, and the transparent electrode layer 26 are laminated one after another on the circuit unit 30.

Moreover, the reverse bias voltage is applied between the transparent electrode layer 26 and the lower electrode layer 25, and the multiplication of electric charge generated by photoelectric conversion is made to generate by impact ionization within the compound semiconductor thin film 24 of chalcopyrite structure.

The circuit unit 30 includes a transistor by which the lower electrode layer 25 is connected to the gate.

The circuit unit 30, and the lower electrode layer 25, the compound semiconductor thin film 24, the buffer layer 36, and the transparent electrode layer 26 laminated one after another on the circuit unit 30 may be integrated.

Moreover, in the solid state imaging device shown in FIG. 22, the compound semiconductor thin film 24 of chalcopyrite structure is formed of $Cu(In_X, Ga_{1-X})Se_2$ (where $0<=X<=1$).

As the lower electrode layer 25, molybdenum (Mo), niobium (Nb), tantalum (Ta), tungsten (W), etc. can be used, for example.

As a formation material of the buffer layer 36, CdS, ZnS, ZnO, ZnMgO, ZnSe, $In_2S_3$, etc. can be used, for example.

The solid state imaging device shown in FIG. 22 can also be composed as an image sensor having sensitivity also in a near infrared optical wavelength region.

The solid state imaging device shown in FIG. 22 may include a color filter on the transparent electrode layer 26. The color filter is effective also as one at 3 couples by providing for red, green, and blue in the adjoining pixels 5. It is effective also as one at 4 couples by adding the filter for near-infrared rays. These 4 couples may be disposed in the matrix shape of 2×2. The color filter can also be formed by multilayering of a gelatin film, for example.

In the solid state imaging device shown in FIG. 22, the gate electrode 16 and the photoelectric conversion unit 28 of the n channel MOS transistor which compose a part of CMOS are electrically connected by the VIA electrode 32 disposed on the gate electrode 16.

Since an anode of a photo diode which composes the photoelectric conversion unit 28 is connected to the gate electrode 16 of the n channel MOS transistor, optical information detected in the photo diode is amplified by the aforementioned n channel MOS transistor.

Also, the configuration which has the buffer layer 36 as the embodiment is mentioned above. Although the leakage current can be reduced by the buffer layer 36, the present invention is not limited to the configuration. It may be a configuration of providing an electrode layer without the buffer layer on the compound semiconductor thin film (CIGS) layer.

A circuit configuration of one pixel $C_{ij}$ of the solid state imaging device composed by applying the photoelectric conversion device according to the first embodiment is expressed by photo diode PD and three MOS transistors, for example, as shown in FIG. 23(a). On the other hand, a circuit configuration of one pixel $C_{ij}$ of the solid state imaging device according to the comparative example of the present invention is shown, for example, as shown in FIG. 23(b). In the solid state imaging device composed by applying the photoelectric conversion device according to the first embodiment, in order to apply the high voltage of reverse bias between the anode and cathode of photo diode PD, it is necessary to use a circuit configuration different from the circuit configuration of one pixel $C_{ij}$ of the solid state imaging device according to the comparative example to which the relatively low voltage is applied.

Moreover, as for the solid state imaging device composed by applying the photoelectric conversion device according to the first embodiment, a photoelectric conversion cell composed of the circuit unit 30 and the photoelectric conversion unit is integrated by one-dimensional matrix shape or two-dimensional matrix shape.

As shown in FIG. 24, the solid state imaging device composed by applying the photoelectric conversion device according to the first embodiment includes: a plurality of word lines $WL_i$ (where i=1 to m, and m is an integer) disposed in a row direction; a plurality of bit lines $BL_j$ (where j=1 to n, and n is an integer) disposed in a column direction; a pixel $C_{ij}$ disposed at the intersection between the word line $WL_i$ and the bit line $BL_j$; a vertical scan circuit 120 connected to the plurality of word lines $WL_i$; a read-out circuit 160 connected to the plurality of bit lines $BL_j$; and a horizontal scan circuit 140 connected to the read-out circuit 160. In addition, although shown by the matrix of 3×3 in the configuration example of FIG. 24, it is extensible to the matrix of m×n as mentioned above.

The circuit configuration of each pixel shown in FIG. 24 corresponds to FIG. 23(a). The buffer 100 is a source follower surrounded with the dashed line of FIG. 23(a), and is composed of the constant current source Ic and MOS transistor $M_{SF}$. The gate of select MOS transistor $M_{SEL}$ is connected to the word line WL. Target voltage $V_t$ (V) is applied to the cathode of photo diode PD. The capacitor $C_{PD}$ is a depletion layer capacitance of photo diode PD, and is a capacitor for performing the charge storage.

The drain of MOS transistor $M_{SF}$ for source follower is connected to the power supply voltage $V_{DDPD}$. The anode of photo diode PD is connected to MOS transistor $M_{RST}$ for reset, and the photo diode PD is reset by the initial state at the timing of the signal inputted into the reset terminal RST.

In addition, although the circuit unit 30 is shown by the example of the semiconductor integrated circuit placed on the semiconductor substrate 10 in the example of FIG. 22, the circuit unit 30 can also be formed with the thin film transistor integrated circuit which integrates the thin film transistor formed on the thin film formed on the glass substrate, for example.

As clearly from FIG. 3, in the solid state imaging device shown in FIG. 22, the compound semiconductor thin film 24 disposed on the lower electrode layer 25 is separated mutually via the isolation region 34, between adjoining pixel cells.

Moreover, the buffer layer 36 disposed on the compound semiconductor thin film 24 and the isolation region 34 is formed in one piece all over the semiconductor substrate surface.

In FIG. 22, a gate insulating film disposed on the semiconductor substrate 10 between source/drain regions 12 is omitting illustration. Moreover, a VIA electrode 32 embedded in an interlayer insulating film 20 is disposed between the gate electrode 16 and the lower electrode layer 25.

Moreover, in a plurality of integrated pixels, the transparent electrode layer 26 is formed on the semiconductor substrate surface in one piece, and is performed in common electrically.

That is, the transparent electrode layer 26 becomes a cathode electrode of the photo diode (PD) which composes the photoelectric conversion unit 28, and is made by the constant potential (target voltage $V_t$) for applying a high electric field. Therefore, in a plurality of integrated pixels, it is not necessary to perform isolation formation of the cathode electrode of the photo diode (PD) which composes the photoelectric conversion unit 28, and it is formed on the semiconductor substrate surface in one piece, and is performed in common electrically.

By the laminating structure of the circuit unit 30 and the photoelectric conversion unit 28, the whole pixel region of the photoelectric conversion cell is usable as a substantial photoelectric conversion region. Accordingly, in the CMOS type image sensor, the optical aperture is about 80 to about 90% compared with about 30 to about 40% of the optical aperture at the time of forming in the semiconductor substrate by applying the photoelectric conversion unit 28 as a pn junction diode, and it has a large improvement effect.

In addition, since the transparent electrode layer (ZnO film) 26 becomes equipotential, it is not necessary to perform isolation format ion of the transparent electrode layer (ZnO film) 26 for every pixel, the electrode composed of aluminum etc. may be disposed to be meshed shaped or stripe shaped on the transparent electrode layer in a fixed pitch, in the range which does not have on the optical aperture of a pixel, in the case of the large capacity area sensor etc. with which specific resistance becomes a problem.

According to the first embodiment, it can provide of the photoelectric conversion device of high S/N ratio which improved detection efficiency substantially also with low illumination, and the fabrication method for such photoelectric conversion device, and a solid state imaging device, by applying the high electric field to the photoelectric conversion unit which used the chalcopyrite type semiconductor, and generating the multiplication of the electric charge by impact ionization and improving dark current characteristics.

According to the first embodiment, it can provide of the photoelectric conversion device which the multiplication phenomenon not observed conventional can be observed by improving dark current characteristics, and can also be detected in the light of low illumination, and the fabrication method for such photoelectric conversion device.

According to the first embodiment, it can provide of the solid state imaging device of high S/N ratio which improved detection efficiency substantially also with low illumination, by applying the high electric field to the photoelectric conversion unit which used the chalcopyrite type semiconductor, and generating the multiplication of the electric charge by impact ionization and improving dark current characteristics.

According to the first embodiment, it can provide the solid state imaging device which the multiplication phenomenon not observed conventional can be observed by improving dark current characteristics, and can also be detected in the light of low illumination.

[Second Embodiment]
(Plane Pattern Configuration)

A whole schematic plane pattern configuration of a solid state imaging device composed by arranging a photoelectric conversion device according to a second embodiment of the present invention in two dimensions is the same as that of FIG. 1. Therefore, the explanation is omitted.

(Photoelectric Conversion Device)

As shown in FIG. 25, a schematic cross-section structure of the photoelectric conversion device according to the second embodiment of the present invention includes a circuit unit 30 formed on a substrate, and a photoelectric conversion unit 28 disposed on the circuit unit 30. In addition, in FIG. 25, illustration of a lower electrode layer 25 and a buffer layer 36 is omitted.

The photoelectric conversion device shown in FIG. 25 includes: a circuit unit 30 formed on the semiconductor substrate 10; a lower electrode layer 25 disposed on the circuit unit 30; a compound semiconductor thin film 24 of a chalcopyrite structure disposed on the lower electrode layer 25; a buffer layer 36 disposed on the compound semiconductor thin film 24; and a transparent electrode layer 26 disposed on the buffer layer 36.

Moreover, the lower electrode layer 25, the compound semiconductor thin film 24, the buffer layer 36, and the transparent electrode layer 26 are laminated one after another on the circuit unit 30.

In the photoelectric conversion device according to the second embodiment, reverse bias voltage is applied between the transparent electrode layer 26 and the lower electrode layer 25, and the multiplication of electric charge generated by photoelectric conversion is made to generate by impact ionization within the compound semiconductor thin film 24 of chalcopyrite structure.

The circuit unit 30 includes a transistor by which the lower electrode layer 25 is connected to a source or a drain.

The circuit unit 30, and the lower electrode layer 25, the compound semiconductor thin film 24, the buffer layer 36, and the transparent electrode layer 26 laminated one after another on the circuit unit 30 may be integrated.

In the photoelectric conversion device shown in FIG. 25, the compound semiconductor thin film 24 of chalcopyrite structure is formed by $Cu(In_X, Ga_{1-X})Se_2$ (where $0<=X<=1$).

As the lower electrode layer 25, molybdenum (Mo), niobium (Nb), tantalum (Ta), tungsten (W), etc. can be used, for example.

Moreover, as a formation material of the buffer layer 36, CdS, ZnS, ZnO, ZnMgO, ZnSe, $In_2S_3$, etc. can be used, for example.

The transparent electrode layer 26 is composed of a non-doped ZnO film (i-ZnO) disposed on the compound semiconductor thin film 24, and an n type ZnO film disposed on the non-doped ZnO film (i-ZnO).

The photoelectric conversion device shown in FIG. 25 can also be composed as a photosensor having sensitivity also in a near infrared optical wavelength region.

Also, the compound semiconductor thin film 24 includes the surface with a high resistivity layer (i type CIGS layer).

In FIG. 25, an n channel MOS transistor which composes a part of CMOS is shown in the circuit unit 30, and the circuit unit 30 includes: a semiconductor substrate 10; source/drain regions 12 formed in the semiconductor substrate 10; a gate insulating film 14 disposed on the semiconductor substrate 10 between the source/drain regions 12; a gate electrode 16 disposed on the gate insulating film 14; a VIA0 electrode 17 disposed on the source/drain region 12, a wiring layer 18 for source/drain disposed on the VIA0 electrode 17, and a VIA1 electrode 23 disposed on the wiring layer 18.

All of the gate electrode 16, the VIA0 electrode 17, the wiring layer 18, and the VIA1 electrode 23 are formed in an interlayer insulating film 20.

A VIA electrode 33 disposed on the source/drain region 12 is formed of the VIA0 electrode 17, the wiring layer 18 disposed on the VIA0 electrode 17, and the VIA1 electrode 23 disposed on the wiring layer 18.

In the photoelectric conversion device shown in FIG. 25, the source/drain region 12 and the photoelectric conversion unit 28 of the n channel MOS transistor which compose a part of the CMOS are electrically connected via the VIA electrode 33 disposed on the source/drain region 12.

In the photoelectric conversion device shown in FIG. 25, there is no amplifying function in the photoelectric conversion device itself compared with the first embodiment reflecting the difference in the circuit configuration.

More detailed cross-sectional configuration chart including adjoining pixels of the solid state imaging device composed by arranging the photoelectric conversion device according to the second embodiment in two dimensions is similarly expressed as FIG. 3. In FIG. 3, it corresponds to the case of providing the VIA electrode 33 instead of the VIA electrode 32.

As clearly from FIG. 3, the compound semiconductor thin film 24 disposed on the lower electrode layer 25 and the lower electrode layer 25 is separated each other via the isolation region 34 formed with the interlayer insulating film between adjoining pixel cells. Moreover, the buffer layer 36 disposed on the compound semiconductor thin film 24 is formed in one piece all over the semiconductor substrate surface. Also, the transparent electrode layer 26 is formed in one piece all over the semiconductor substrate surface, and is performed in common electrically.

In addition, the width of the compound semiconductor thin film 24 and the width of the lower electrode layer 25 may be equivalent, or more for details, as shown in FIG. 3, it may set to so that the width of the compound semiconductor thin film 24 may become larger than the width of the lower electrode layer 25.

According to the above-mentioned configuration, the void and pinhole which are occurred in an underlying CIGS thin film are embedded by a semi-insulating layer and the leak can be prevented, by providing a non-doped ZnO film (i-ZnO) as the transparent electrode layer 26. Therefore, the dark current of the pn junction interface can be reduced by applying the non-doped ZnO film (i-ZnO) as a thick film.

Since the anode of the photo diode which composes the photoelectric conversion unit 28 is connected to the source/drain region 12 of the n channel MOS transistor, the optical information detected in the photo diode is switched by the n channel MOS transistor.

In addition, the circuit unit 30 can also be formed by the thin film transistor of the CMOS structure formed on a thin film formed on a glass substrate, for example.

Also in the photoelectric conversion device according to the second embodiment, since the configuration of the photoelectric conversion unit 28 is the same as that of the photoelectric conversion device according to the first embodiment, both of the multiplication mechanisms of the photoelectric conversion unit shown in the FIG. 4 to FIG. 7, and the fabrication methods of the photoelectric conversion device shown in FIG. 10, etc. are the same as that of the photoelectric conversion device according to the first embodiment. Therefore, these explanations are omitted.

Also, the configuration which has the buffer layer 36 as the embodiment is mentioned above. Although the leakage current can be reduced by the buffer layer 36, the present invention is not limited to the configuration. It may be a configuration of providing an electrode layer without the buffer layer on the compound semiconductor thin film (CIGS) layer.

(Solid State Imaging Device)

A solid state imaging device composed by applying the photoelectric conversion device according to the second embodiment of the present invention includes: a circuit unit 30 formed on the substrate 10, and a photoelectric conversion unit 28 disposed on the circuit unit 30 as shown in FIG. 26 as a cross-sectional diagram of one pixel part. In addition, in FIG. 26, illustration of a buffer layer 36 is omitted.

The solid state imaging device shown in FIG. 26 includes: a circuit unit 30 formed on the semiconductor substrate 10; a lower electrode layer 25 disposed on the circuit unit 30 and mutually separated between the pixels adjoining to a column direction or a row direction; a compound semiconductor thin film 24 of the chalcopyrite structure disposed on the lower electrode layer 25 and mutually separated between the pixels adjoining to a column direction or a row direction; a buffer layer 36 disposed on the compound semiconductor thin film 24; and a transparent electrode layer disposed on the buffer layer 36 and having planarization structure between the adjoining pixels Herein, the column direction is a direction to extend a bit line which reads a signal of each pixel, and the row direction is a direction to intersect perpendicularly in the column direction and to extend a word line which is an address line to each pixel.

Moreover, the lower electrode layer 25, the compound semiconductor thin film 24, the buffer layer 36, and the transparent electrode layer 26 are laminated one after another on the circuit unit 30.

The reverse bias voltage is applied between the transparent electrode layer 26 and the lower electrode layer 25, and the multiplication of electric charge generated by photoelectric conversion is made to generate by impact ionization within the compound semiconductor thin film 24 of chalcopyrite structure.

The circuit unit 30 includes a transistor by which the lower electrode layer 25 is connected to a source or a drain.

The circuit unit 30, and the lower electrode layer 25, the compound semiconductor thin film 24, the buffer layer 36, and the transparent electrode layer 26 laminated one after another on the circuit unit 30 may be integrated.

Moreover, in the solid state imaging device shown in FIG. 24, the compound semiconductor thin film 24 of chalcopyrite structure is formed of $Cu(In_x, Ga_{1-x})Se_2$ (where $0<=X<=1$).

As the lower electrode layer 25, molybdenum (Mo), niobium (Nb), tantalum (Ta), tungsten (W), etc. can be used, for example.

As a formation material of the buffer layer 36, CdS, ZnS, ZnO, ZnMgO, ZnSe, $In_2S_3$, etc. can be used, for example.

The solid state imaging device shown in FIG. 26 can also be composed as an image sensor having sensitivity also in a near infrared optical wavelength region.

The solid state imaging device shown in FIG. 26 may include a color filter on the transparent electrode layer 26. The color filter is effective also as one at 3 couples by providing for red, green, and blue in the adjoining pixels 5. It is effective also as one at 4 couples by adding the filter for near-infrared rays. These 4 couples may be disposed in the matrix shape of 2×2. The color filter can also be formed by multilayering of a gelatin film, for example.

In the solid state imaging device shown in FIG. 26, the source/drain region 12 and the photoelectric conversion unit 28 of the n channel MOS transistor which compose a part of the CMOS are electrically connected via the VIA electrode 33 disposed on the source/drain region 12.

Since the anode of the photo diode which composes the photoelectric conversion unit 28 is connected to the source/drain region 12 of the n channel MOS transistor, the optical information detected in the photo diode is switched by the n channel MOS transistor.

Although the circuit configuration of one pixel $C_{ij}$ of the solid state imaging device composed by applying the photoelectric conversion device according to the second embodiment also differs in the circuit configuration from FIG. 23(a), it is expressed by photo diode PD and three MOS transistors (not shown). Also in the solid state imaging device composed by applying the photoelectric conversion device according to the second embodiment, in order to apply the high voltage of reverse bias between the anode and cathode of photo diode PD, it is necessary to use a circuit configuration different from the circuit configuration of one pixel $C_{ij}$ of the solid state imaging device according to the comparative example to which the relatively low voltage is applied.

Moreover, as for the solid state imaging device composed by applying the photoelectric conversion device according to the second embodiment, a photoelectric conversion cell composed of the circuit unit 30 and the photoelectric conversion unit is integrated by one-dimensional matrix shape or two-dimensional matrix shape.

Although the solid state imaging device composed by applying the photoelectric conversion device according to the second embodiment differs in the circuit configuration of each pixel $C_{ij}$, the solid state imaging device includes: as well as FIG. 24, a plurality of word lines $WL_i$ (where i=1 to m, and m is an integer) disposed in a row direction; a plurality of bit lines $BL_j$ (where j=1 to n, and n is an integer) disposed in a column direction; a pixel $C_{ij}$ disposed at the intersection between the word line $WL_i$ and the bit line $BL_j$; a vertical scan circuit 120 connected to the plurality of word lines $WL_i$; a read-out circuit 160 connected to the plurality of bit lines $BL_j$; and a horizontal scan circuit 140 connected to the read-out circuit 160. In addition, although shown by the matrix of 3×3 in the configuration example of FIG. 24, it is extensible to the matrix of m×n as above-mentioned.

In addition, although the circuit unit 30 is shown by the example of the semiconductor integrated circuit disposed on the semiconductor substrate 10 in the example of FIG. 26, the circuit unit 30 can also be formed with the thin film transistor integrated circuit which integrates the thin film transistor formed on the thin film formed on the glass substrate, for example.

As clearly from FIG. 3, also in the solid state imaging device shown in FIG. 26, the compound semiconductor thin film 24 disposed on the lower electrode layer 25 is separated mutually via the isolation region 34, between adjoining pixel cells.

The buffer layer 36 disposed on the compound semiconductor thin film 24 and the isolation region 34 is formed in one piece all over the semiconductor substrate surface.

In FIG. 26, the VIA electrode 33 is disposed between the source/drain region 12 and the lower electrode layer 25.

Moreover, in a plurality of integrated pixels, the transparent electrode layer 26 is formed by planarizing on the semiconductor substrate surface in one piece, and is performed in common electrically.

That is, the transparent electrode layer 26 becomes a cathode electrode of the photo diode (PD) which composes the photoelectric conversion unit 28, and is made by the constant potential (for example, target voltage $V_t$) for applying a high electric field. Therefore, in a plurality of integrated pixels, it is not necessary to perform isolation formation of the cathode electrode of the photo diode (PD) which composes the photoelectric conversion unit 28, and it is formed on the semiconductor substrate surface in one piece, and is performed in common electrically.

Also in the solid state imaging device shown in FIG. 26, by the laminating structure of the circuit unit 30 and the photoelectric conversion unit 28, the whole pixel region of the photoelectric conversion cell is usable as a substantial photoelectric conversion region. Accordingly, in the CMOS type image sensor, the optical aperture is about 80 to about 90% compared with about 30 to about 40% of the optical aperture at the time of forming in the semiconductor substrate by applying the photoelectric conversion unit 28 as a pn junction diode, and it has a large improvement effect.

In the solid state imaging device shown in FIG. 26, there is no amplifying function for every pixel reflecting the difference in the circuit configuration.

Also in the solid state imaging device composed by applying the photoelectric conversion device according to the second embodiment of the present invention, all of the formation processes of the compound semiconductor thin film of the chalcopyrite structure shown in FIG. 10, the photoelectric conversion characteristic shown in FIG. 15, the wavelength characteristic of the quantum efficiency of the compound semiconductor thin film (CIGS thin film) shown in FIG. 16, the optical absorption characteristics shown in FIG. 17, and the composition ratio dependence of the bandgap energy of the compound semiconductor thin film shown in FIG. 18. Therefore, these explanations are omitted.

In addition, since the transparent electrode layer (ZnO film) 26 becomes equipotential, it is not necessary to perform isolation formation of the transparent electrode layer (ZnO film) 26 for every pixel, the electrode composed of aluminum etc. may be disposed to he meshed shaped or stripe shaped on the transparent electrode layer (ZnO film) 26 in a fixed pitch, in the range which does not have on the optical aperture of a pixel, in the case of the large capacity area sensor etc. with which specific resistance becomes a problem.

Also, the configuration which has the buffer layer 36 as the embodiment is mentioned above. Although the leakage current can be reduced by the buffer layer 36, the present invention is not limited to the configuration. It may be a configuration of providing an electrode layer without the buffer layer on the compound semiconductor thin film (CIGS) layer.

According to the second embodiment, it can provide of the photoelectric conversion device of high S/N ratio which improved detection efficiency substantially also with low illumination, and the fabrication method for such photoelectric conversion device, and a solid state imaging device, by applying the high electric field to the photoelectric conversion unit which used the chalcopyrite type semiconductor, and generating the multiplication of the electric charge by impact ionization and improving dark current characteristics.

According to the second embodiment, it can provide of the photoelectric conversion device which the multiplication phenomenon not observed conventional can be observed by improving dark current characteristics, and can also be detected in the light of low illumination, and the fabrication method for such photoelectric conversion device.

According to the second embodiment, it can provide of the solid state imaging device of high S/N ratio which improved detection efficiency substantially also with low illumination, by applying the high electric field to the photoelectric conversion unit which used the chalcopyrite type semiconductor, and generating the multiplication of the electric charge by impact ionization and improving dark current characteristics.

According to the second embodiment, it can provide the solid state imaging device which the multiplication phenomenon not observed conventional can be observed by improving dark current characteristics, and can also be detected in the light of low illumination.

[Other Embodiments]

The present invention has been described by the first to second embodiments, as a disclosure including associated description and drawings to be construed as illustrative, not restrictive. With the disclosure, artisan might easily think up alternative embodiments, embodiment examples, or application techniques.

Although $Cu(In_X, Ga_{1-X})Se_2$ (where $0<=X<=1$) is used in the photoelectric conversion device according to first and second embodiments of the present invention, the fabrication method for such photoelectric conversion device, and the solid state imaging device, as a compound semiconductor thin film having the chalcopyrite structure in the photoelectric conversion unit, it is not limited to the configuration.

As the CIGS thin film applied to the compound semiconductor thin film, the thing of composition of $Cu (In_X, Ga_{1-X})(Se_Y, S_{1-Y})$ (where $0<=X<=1$, and $0<=Y<=1$) is also known, and it is available also in the CIGS thin film with such composition.

In addition to the compound semiconductor thin film of the chalcopyrite structure, it can apply other compound semiconductor thin films, such as $CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$, $AgInTe_2$, etc.

Also, although the configuration which has the buffer layer as the embodiment above was explained, the present invention is not limited to the configuration. It may be a configuration of providing an electrode layer without the buffer layer on the compound semiconductor thin film (CIGS) layer.

Such being the case, the present invention covers a variety of embodiments, whether described or not. Therefore, the technical scope of the present invention is appointed only by the invention specific matter related appropriate scope of claims from the above-mentioned explanation.

INDUSTRIAL APPLICABILITY

The photoelectric conversion device and the solid state imaging device of the present invention have high sensitivity also in the near infrared light wavelength region, and therefore are applicable to an image sensor for a security camera (camera which performs sensing of the visible light at daytime and performs sensing of the near infrared light wavelength region at night), a personal authentication camera (camera for performing personal authentication with the near infrared light wavelength region which is not affected by an influence of outdoor daylight) or an in-vehicle camera (camera mounted in a car for visual aid at night, distant visual field securing, etc.), and also an image sensor detecting for near infrared light application of medical application and a photodetection device (photodetector) in a wide wavelength region, an avalanche photodiode, etc.

The invention claimed is:

1. A photoelectric conversion device comprising:
a circuit unit formed on a substrate;
a lower electrode layer disposed on the circuit unit,
a compound semiconductor thin film of chalcopyrite structure disposed on the lower electrode layer;
a buffer layer disposed on the compound semiconductor thin film; and
a transparent electrode layer disposed on the buffer layer,
wherein the lower electrode layer, the compound semiconductor thin film, the buffer layer, and the transparent electrode layer are laminated one after another on the circuit unit, and when a reverse bias voltage is applied between the transparent electrode layer and the lower electrode layer, multiplication of electric charge generated by photoelectric conversion is generated by impact ionization within the compound semiconductor thin film of the chalcopyrite structure, wherein
the circuit unit includes a transistor by which the lower electrode layer is connected to a gate,
an anode of a photo diode composed of the lower electrode layer, the compound semiconductor thin film, and the transparent electrode layer for every pixel is connected to a gate electrode of the transistor, and
the transparent electrode layer being a cathode electrode of the photo diode is formed on the whole surface of a plurality of the pixels in one piece and is electrically common.

2. The photoelectric conversion device according to claim 1, wherein the compound semiconductor thin film of the chalcopyrite structure is formed by $Cu(In_x,Ga_{1-x})Se_2$ (where $0<=x<=1$).

3. The photoelectric conversion device according to claim 1, wherein the transparent electrode layer includes a non-doped ZnO film disposed on the compound semiconductor thin film and an n type ZnO film disposed on the non-doped ZnO film.

4. The photoelectric conversion device according to claim 1, wherein the photoelectric conversion device is a photosensor having sensitivity also in a near infrared optical wavelength region.

5. The photoelectric conversion device according to claim 1, wherein the compound semiconductor thin film includes a high resistivity layer in an interface between the buffer layer and the compound semiconductor thin film.

* * * * *

UNITED STATES PATENT AND TRADEMARK OFFICE
CERTIFICATE OF CORRECTION

| | | |
|---|---|---|
| PATENT NO. | : 8,592,933 B2 | Page 1 of 1 |
| APPLICATION NO. | : 12/937013 | |
| DATED | : November 26, 2013 | |
| INVENTOR(S) | : Kenichi Miyazaki et al. | |

It is certified that error appears in the above-identified patent and that said Letters Patent is hereby corrected as shown below:

On the Title page: Item (30), Foreign Application Priority Data, delete "Nov. 4, 2008" and insert --April 11, 2008--.

Signed and Sealed this
Tenth Day of June, 2014

Michelle K. Lee
*Deputy Director of the United States Patent and Trademark Office*